(12) United States Patent
Braun et al.

(10) Patent No.: US 6,946,675 B2
(45) Date of Patent: *Sep. 20, 2005

(54) MICROELECTRONIC COMPONENTS AND ELECTRONIC NETWORKS COMPRISING DNA

(75) Inventors: Erez Braun, Haifa (IL); Yoav Eichen, Haifa (IL); Uri Sivan, Haifa (IL); Gdalyahu Ben-Joseph, Haifa (IL)

(73) Assignee: Technion Research & Development Foundation Ltd., Haifa (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/462,171
(22) PCT Filed: Jan. 28, 1999
(86) PCT No.: PCT/IL98/00329
§ 371 (c)(1), (2), (4) Date: Mar. 27, 2000
(87) PCT Pub. No.: WO99/04440
PCT Pub. Date: Jul. 14, 1998

(65) Prior Publication Data
US 2002/0171079 A1 Nov. 21, 2002

(30) Foreign Application Priority Data
Jul. 14, 1997 (IL) .............................................. 121312

(51) Int. Cl.[7] .............................................. H01L 51/20
(52) U.S. Cl. ........................ 257/40; 257/213; 257/565; 257/746; 438/99; 438/1
(58) Field of Search .......................... 257/40, 213, 565, 257/746; 438/99, 1

(56) References Cited

U.S. PATENT DOCUMENTS

| 3,833,894 A | 9/1974 | Aviram et al. |
| 4,314,821 A | 2/1982 | Rice |

(Continued)

FOREIGN PATENT DOCUMENTS

| EP | 0 364 208 A1 | 4/1990 |
| EP | 0 444 840 A1 | 9/1991 |
| JP | 04-148669 | 5/1992 |

(Continued)

OTHER PUBLICATIONS

Ackley et al *IEEE* DNA... "Optoelectronics", Apr. 1998.*
J. L. Coffer et al., "Dictation of the Shape of Mesoscale Semiconductor Nanoparticle Assemblies by Plasmid DNA", Appl. Phys. Lett. 69 (25), Dec. 16, 1996, pp. 3851–3853.
D. B. Hall et al., "Oxidative DNA Damage Through Long-range Electron Transfer", Nature, vol. 382, Aug. 22, 1996, pp. 731–735.

(Continued)

*Primary Examiner*—Jerome Jackson
(74) *Attorney, Agent, or Firm*—Nixon Peabody LLP

(57) ABSTRACT

A microelectronic network is fabricated on a fibrous skeleton by binding or complexing electronically functional substances to the nucleic acid skeleton. The skeleton comprises fibers with nucleotide chains. The assembly of the fibers into a network is based on interactions of nucleotide chain portions of different fibers.

31 Claims, 20 Drawing Sheets

U.S. PATENT DOCUMENTS

| | | |
|---|---|---|
| 4,822,566 A | 4/1989 | Newman |
| 5,063,417 A | 11/1991 | Hopfield |
| 5,089,545 A | 2/1992 | Pol |
| 5,284,748 A | 2/1994 | Mroczkowski et al. |
| 5,312,527 A | 5/1994 | Mikkelsen et al. |
| 5,445,934 A | 8/1995 | Fodor et al. |
| 5,561,043 A | 10/1996 | Cantor et al. |
| 5,561,071 A | 10/1996 | Hollenberg et al. |
| 5,563,424 A | 10/1996 | Yang et al. |
| 5,653,959 A | 8/1997 | Hollis et al. |
| 5,705,348 A | 1/1998 | Meade et al. |
| 5,707,845 A | 1/1998 | Ueyama et al. |
| 5,739,308 A | 4/1998 | Kandimalla et al. |
| 5,770,369 A | 6/1998 | Meade et al. |
| 5,780,234 A | 7/1998 | Meade et al. |
| 5,787,332 A | 7/1998 | Heller et al. |
| 5,824,473 A | 10/1998 | Meade et al. |
| 5,837,546 A | 11/1998 | Allen et al. |
| 5,858,659 A | 1/1999 | Sapolsky et al. |
| 5,874,046 A | 2/1999 | Megerle |
| 5,876,976 A | 3/1999 | Richards et al. |
| 5,891,630 A | 4/1999 | Eggers et al. |
| 5,914,505 A | 6/1999 | Hisada et al. |
| 5,946,550 A * | 8/1999 | Papadimitrakopoulos .... 257/40 |
| 5,948,897 A | 9/1999 | Sen et al. |
| 5,952,172 A | 9/1999 | Meade et al. |
| 5,965,133 A | 10/1999 | Cantor et al. |
| 5,985,550 A | 11/1999 | Goodman et al. |
| 6,013,170 A | 1/2000 | Meade |
| 6,051,380 A | 4/2000 | Sosnowski et al. |
| 6,060,023 A | 5/2000 | Maracas |
| 6,071,699 A | 6/2000 | Meade et al. |
| 6,087,100 A | 7/2000 | Meade et al. |
| 6,093,370 A | 7/2000 | Yasuda et al. |
| 6,210,880 B1 | 4/2001 | Lyamichev et al. |
| 6,248,529 B1 | 6/2001 | Connolly |
| 6,291,188 B1 | 9/2001 | Meade et al. |
| 6,399,303 B1 | 6/2002 | Connolly |

FOREIGN PATENT DOCUMENTS

| | | |
|---|---|---|
| WO | WO 90/05300 | 5/1990 |
| WO | WO 93/25003 | 12/1993 |
| WO | WO 94/05045 | 3/1994 |
| WO | WO 95/20320 | 8/1995 |
| WO | WO 96/30508 | 10/1996 |
| WO | WO 97/44651 | 11/1997 |
| WO | WO 98/31839 | 7/1998 |
| WO | WO 98/53841 | 12/1998 |
| WO | WO 99/29711 | 6/1999 |
| WO | WO 99/35256 | 7/1999 |
| WO | WO 99/36573 | 7/1999 |
| WO | WO 99/57550 | 11/1999 |
| WO | WO 99/60165 | 11/1999 |
| WO | WO 00/25136 | 5/2000 |

OTHER PUBLICATIONS

E. Braun et al., "DNA–templated Assembly and Electrode Attachment of a Conducting Silver Wire", Nature, Feb. 19, 1998, vol. 291, pp. 775–778.

C. Mirkin et al., "A DNA–based Method for Rationally Assembling into Macroscopic Materials", Nature, vol. 382, Aug. 15, 1996, pp. 607–609.

A. P. Alivisatos et al., "Organization of 'Nanocrystal Molecule' Using DNA", Nature, vol. 382, Aug. 15, 1996, pp. 609–611.

Size, *Physics of Semiconductor Devices*, 2$^{nd}$ Ed., pp. 349, 490–495 (date unknown).

Klein et al., "An Approach to Electrical Studies of Single Nanocrystals," *Appl. Phys. Lett.*, 68(18):2574–2576 (1996).

Sato et al., "Single Electron Transistor Using a Molecularly Linked Gold Colloidal Particle Chain," *J. Appl. Phys.*, 82(2):696–701 (1997).

Grabar et al., "Kinetic Control of Interparticle Spacing in Au Colloid–Based Surfaces: Rational Nanometer–Scale Architecture," *J. Am. Chem Soc.*, 118:1148–1153 (1996).

Chen et al., "Synthesis from DNA of a Molecule with the Connectivity of a Cube," *Nature*, 350:631–633 (1991).

Fink et al., "Electrical Conduction Through DNA Molecules," *Nature*, 398:407–410 (1999).

Averin et al., "Single Electronics: A Correlated Transfer of Single Electrons and Cooper Pairs in Systems of Small Tunnel Junctions," in Altshuler, eds., *Mesoscopic Phenomena in Solids,* New York, New York:Elsevier Science Publishing Company, Inc., pp. 173–271 (1991).

Kastner, "The Single–Electron Transistor," *Reviews of Modern Physics,* 64(3):849–858 (1992).

Porath et al., "Single Electron Tunneling and Level Spectroscopy of Isolated $C_{60}$ Molecules," *J. Appl. Phys.,* 81(5):2241–2244 (1997).

Meirav et al., "Single–Electron Phenomena in Semiconductors," *Semicond. Sci. Technol.,* 11:255–284 (1996).

Kouwenhoven et al., "Introduction to Mesoscopic Electron Transport," in Sohn, eds., *Mesoscopic Electron Transport,* The Netherlands:Kluwer Academic Publishers, pp. 1–44 (1997).

Langer et al., "Quantum Transport in a Multiwalled Carbon Nanotube," *Physical Review Letters,* 76(3):479–482 (1996).

Bensimon et al., "Stretching DNA with a Receding Meniscus: Experiments and Models," *Physical Review Letters,* 74(23):4754–4757 (1995).

Bensimon et al., "Alignment and Sensitive Detection of DNA by a Moving Interface," *Science,* 265:2096–2098 (1994).

Wirtz, "Direct Measurement of the Transport Properties of a Single DNA Molecule," *Physical Review Letters,* 75(12):2436–2439 (1995).

Zimmerman et al., "DNA Stretching on Functionalized Gold Surfaces," *Nucleic Acids Res.,* 22(3):492–497 (1994).

Barton, "Metal/Nucleic–Acid Interactions," in Bertini, eds., *Bioorganic Chemistry,* Sausalito, California:University Science Books, pp. 455–503 (1994).

Marzilli et al., "An Extension of the Role of O(2) of Cytosine Residues in the Binding of Metal Ions, Synthesis and Structure of an Unusual Polymeric Silver(I) Complex of 1–Methylcytosine," *J. Am. Chem. Soc.,* 99(8):2797–2798 (1977).

Eichorn, "Complexes of Nucleosides and Nucleotides," in Eichhorn, eds., *Inorganic Biochemistry,* vols. 1 and 2, New York, New York:American Elsevier Publishing Company, pp. 1191–1243 (1973).

Roberts, "A New Procedure for the Detection of Gold in Animal Tissues: Physical Development," *Proceedings of the Section of Sciences,* vol. XXXVIII, Amsterdam:N.V. Noord– Hollandsche Uitgeversmaatschappij, pp. 540–544 (1935).

Holgate et al., "Immunogold–Silver Staining: New Method of Immunostaining with Enhanced Sensitivity," *J. Histochem. and Cytochem.,* 31(7):938–944 (1983).

Danscher et al., "Light Microscopic Visualization of Colloidal Gold on Resin–Embedded Tissue," *J. Histochem. and Cytochem.,* 31(12):1394–1398 (1983).

Mueller et al., "Design and Synthesis of a Knot from Single–Stranded DNA," *J. Am. Chem. Soc.,* 113(16):6306–6308 (1991).

Du et al., "Synthesis of a DNA Knot Containing Both Positive and Negative Nodes," *J. Am. Chem. Soc.,* 114:9652–9655 (1992).

Seeman et al., "Synthetic DNA Knots and Catenanes," *New J. Chem.,* 17:739–755 (1993).

Kallenbach et al., "An Immobile Nucleic Acid Junction Constructed from Oligonucleotides," *Nature,* 305:829–831 (1983).

Goffeau, "Molecular Fish on Chips," *Nature,* 385:202–203 (1997).

Birrell et al., "Silver–Enhanced Colloidal Gold as a Cell Surface Marker for Photoelectron Microscopy," *J. Histochem. and Cytochem.,* 34(3):339–345 (1986).

Danscher, "Localization of Gold in Biological Tissue. A Photochemical Method for Light and Electromicroscopy," *Histochem.,* 71:81–88 (1981).

Scopsi et al., "Increased Sensitivity in Immunocytochemistry. Effects of Double Application of Antibodies and of Silver Intensification on Immunogold and Peroxidase–Antiperoxidase Staining Techniques," *Histochem.,* 82:321–329 (1995).

Scopsi et al., "Colloidal Gold Probes in Immunocytochemistry. An Optimization of Their Application in Light Microscopy by Use of Silver Intensification Procedures," *Med. Biol.,* 64:139–145 (1986).

Springall et al., "The Potential of the Immunogold–Silver Staining Method for Paraffin Sections," *Histochem.,* 81:603–608 (1984).

Teasdale et al., "Identification of Oestrogen Receptors in Cells of Paraffin–Processed Breast Cancers by IGSS," *Histochem.,* 87:185–187 (1987).

Burroughes et al., "Light–Emitting Diodes Based on Conjugated Polymers," *Nature,* 347:539–541 (1990).

Eichen et al., "Self–Assembly of Nanoelectronic Compounds and Circuits Using Biological Templates," *Acid Polymerica* 49: 663–670 (1998) (abstract).

Di Mauro et al., "DNA Technology in Chip Construction," *Advanced Materials* 5:384–386 (1993) (abstract).

Niemeyer, "DNA as a Material for Nanotechnology; DNA Chip, Biochip and Biosensor Construction," *Angew. Chem. Int. Engl.* 36: 585–587 (1997) (abstract).

Niemeyer, "DNA Organisation in Materials for the Nano–Technology," *Angew. Chem.* 109: 603–606 (1997) (abstract).

Dagani, "Supramolecular Assemblies DNA Used to Organize Gold Nanoparticles," *Chemical & Engineering News* 74: 6 (1996).

Wilkinson, "DNA Enables Nanoconstruction," *Chemical & Engineering News* 76: 18 (1998).

Robinson et al., "The Design of a Biochip: A Self–Assembling Molecular–Scale Memory Device," *Protein Engineering,* 1(4):295–300 (1987).

* cited by examiner

TO FIG. 3B

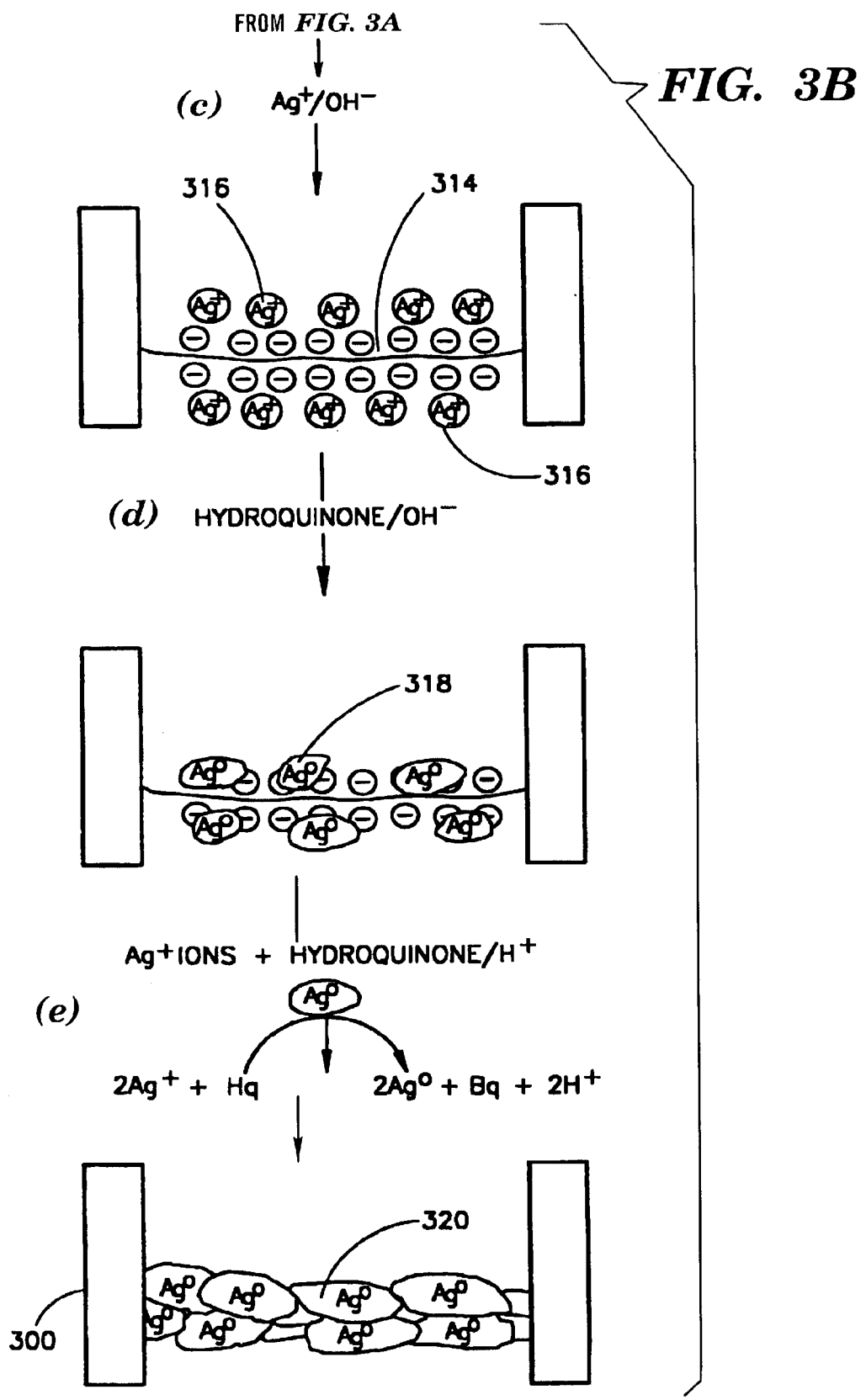

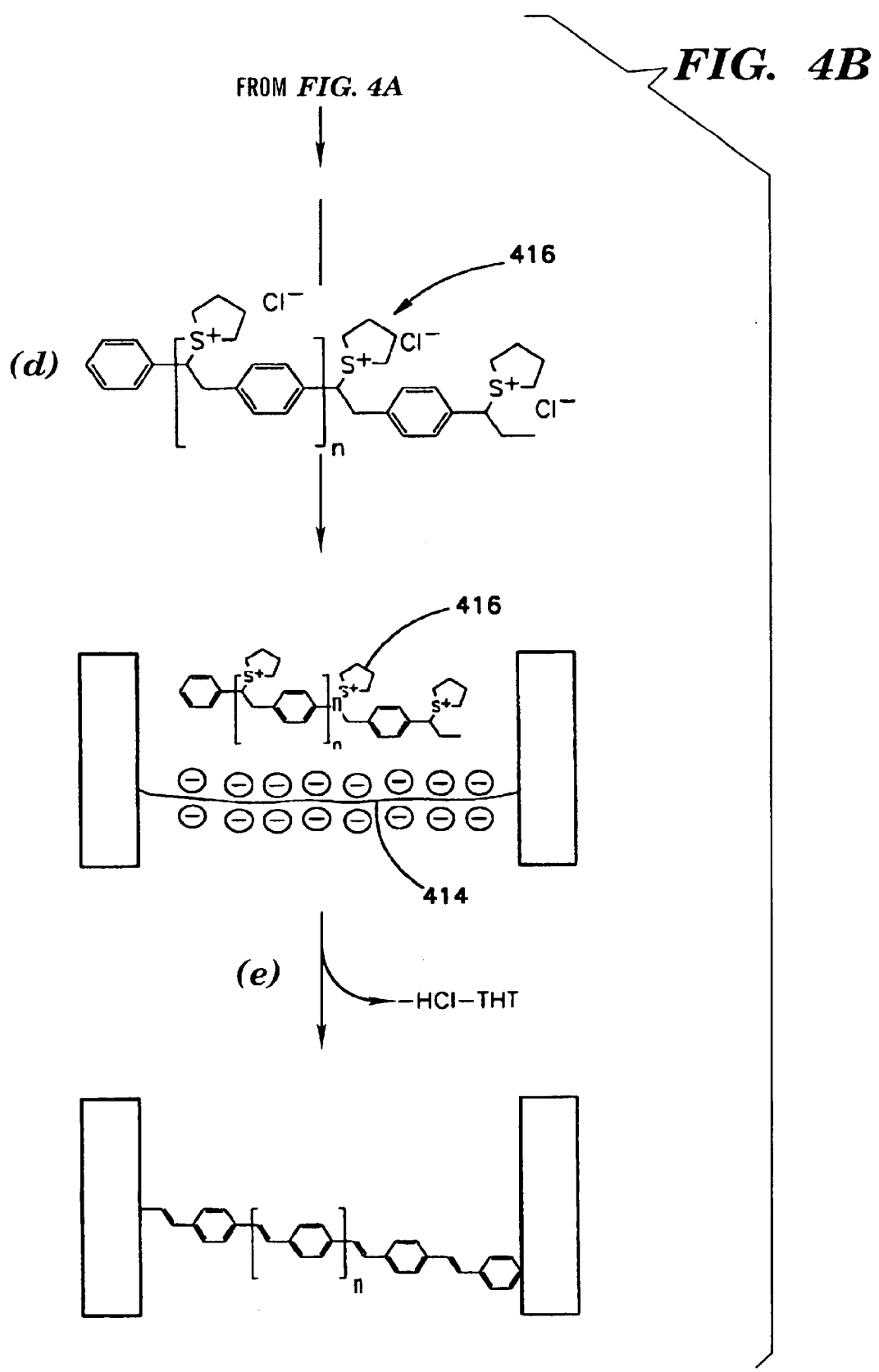

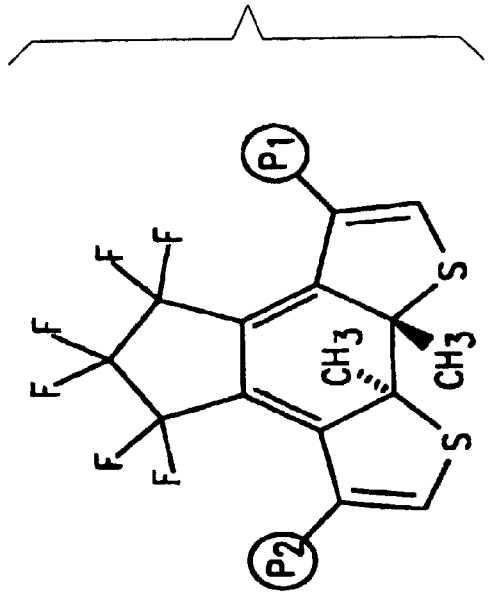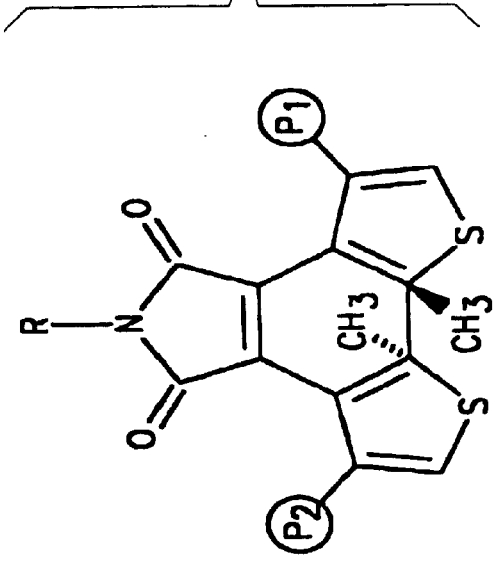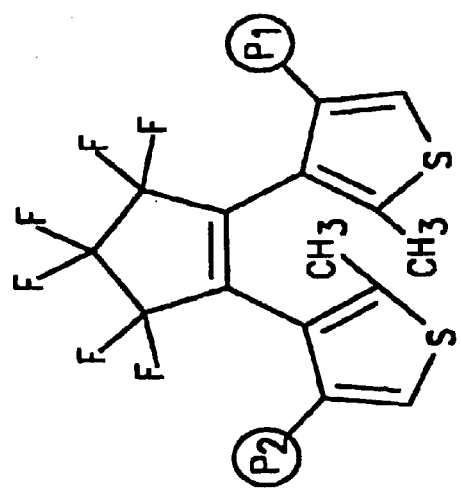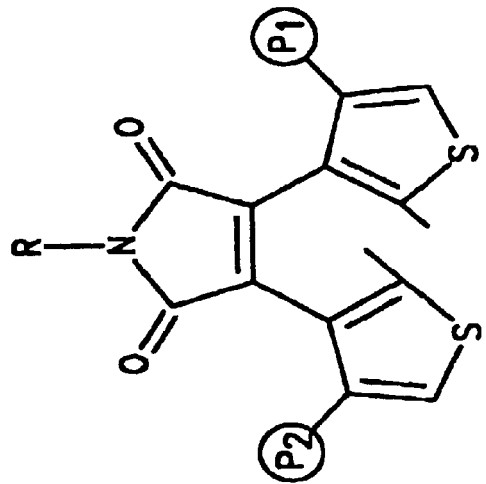
FIG. 7A    FIG. 7B

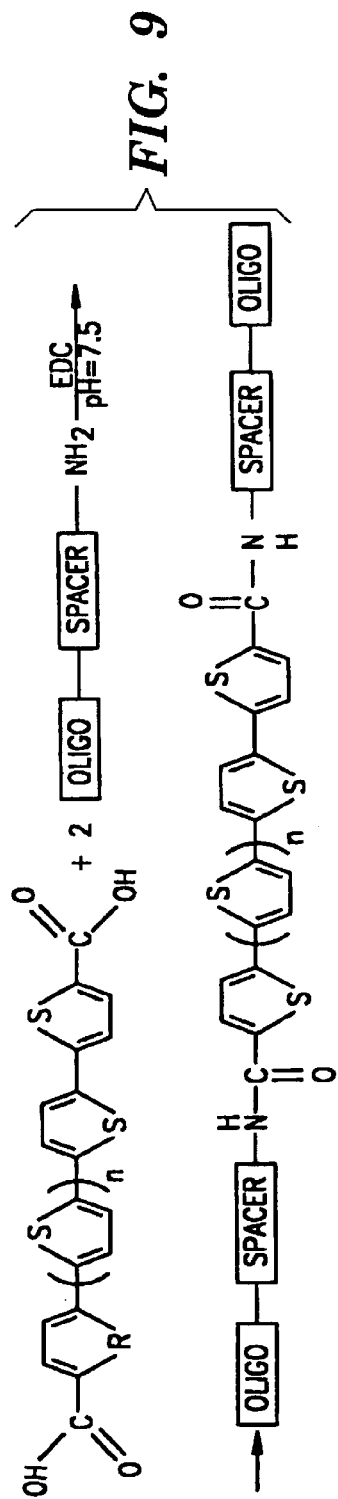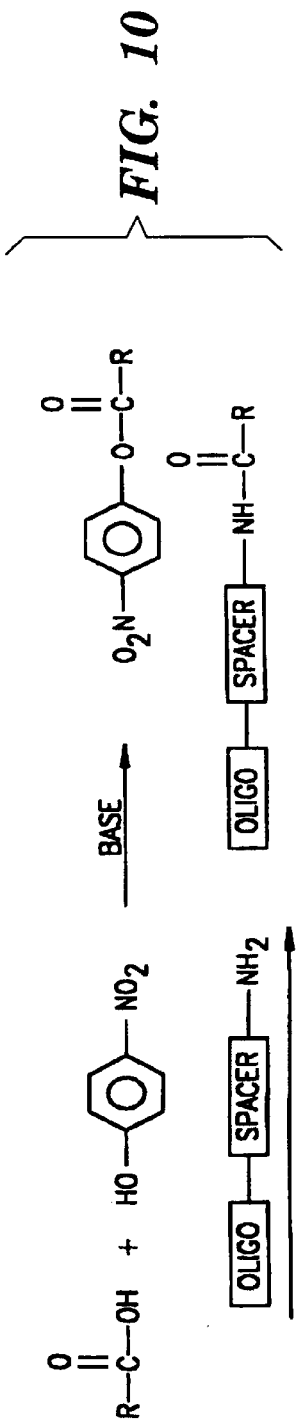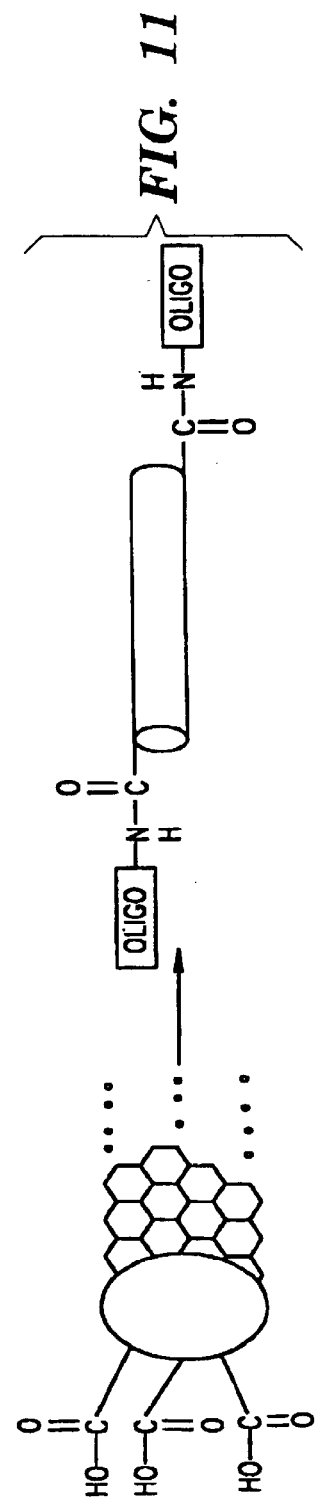

MICROELECTRONIC COMPONENTS AND ELECTRONIC NETWORKS COMPRISING DNA

FIELD OF THE INVENTION

The present invention is generally in the field of electronics and relates to electronic networks and circuits as well as to components and junctions of such networks or circuits.

PRIOR ART

Prior art believed to be relevant as background of the invention as well as to manufacture or experimental techniques described herein is listed below:

1. Averin, D. V. and Likharev, K. K., in *Mesoscopic Phenomena in Solids*, eds. Altshuler B., Lee P., and Webb, R., Elsevier, Amsterdam, p. 173, 1991.
2. Grabert H., and Devoret M., eds., Single Charge Tunneling, Plenum, New York, 1992.
3. Kastner, M. A., *Rev. Mod. Phys.* 64:849, 1992.
4. Porath, D. and Milloh, O., *J. Appl. Phys.*, 85:2241, 1997.
5. Meirav, U. and Foxman, E. B., *Semiconductor Science and Technology*, 11:255, 1996.
6. Kouwenhoven, L. P. et al., Proceedings of the Advanced Study Institute on *Mesoscopic Electron Transport*. Kouwenhoven, L. P., Schon, G., and Sohn, L. L. eds., Kluwer, 1997.
7. Langer, L., et al., *Phys. Rev. Lett.*, 76, 479, 1996.
8. Lehn, J. M., *Supramolecular Chemistry: Concepts and Perspectives*, VCH, Weinheim, 1995.
9. Austin, R. J., et al., *Phys. Rev. Lett.*, 50:32, 1997.
10. Bensimon, D., et al., *Phys. Rev. Lett.*, 74:4754, 1995.
11. Bensimon A., et al., *Science*, 265:2096, 1994.
12. Wirtz, D., *Phys. Rev. Lett.*, 75:2436, 1995.
13. Zimmermann, R. M., and Cox, E. C., *Nucleic Acids Research*, 22:492, 1994.
14. Mirkin, C. A., et al., *Nature*, 382:607, 1996.
15. Alivisatos, A. P., et al., *Nature*, 382609: 1996.
16. Coffer, J. L., et al., *Appl. Phys. Lett.*, 69(25):3851, 1996.
17. Hollenberg, et al., U.S. Pat. No. 5,561,071.
18. Hall, B. D., Holmlin, R. E., and Barton, K., *Nature*, 382:731, 1996.
19. Barton, J. K., in *Bioinorganic Chemistry*, eds. Bertini, I., et al., University Science Books, Mill Avalley, 1994.
20. Spiro T. G., ed., *Nucleic Acid—Metal Ion Interactions*, Wiley Interscience, New York, 1980.
21. Marzilli, L. G., Kistenmacher, T. J., and Rossi, M., *J. Am. Chem. Soc.*, 99:2797, 1977.
22. Eichorn, G. L., ed., *Inorganic Biochemistry*, Vol. 2, Elsevier, Press, Amsterdam, Ch. 33–34, 1973.
23. Roberts, W. J., *Proc. R. Acad.* (Amsterdam) 38:540, 1935.
24. Holgate, C. S., et al., *The J. of Histochemistry and Cytochemistry*, 31:938, 1983.
25. Danscher, G., and Norgaard, J. O. R., ibid., 31:1394, 1983.
26. Burroughes, J. H., et al., *Nature*, 347:539, 1990.
27. J. E. Mueller, S. M. Du and N. C. Seeman, *J. Am. Chem. Soc.*, 113:6306–6308, 1991.
28. S. M. Du, and N. C. Seeman, *J. Am. Chem. Soc.*, 114:9652–9655, 1992.
29. N. C. Seeman, J. Chen, S. M. Du, J. E. Mueller, Y. Zhang, T. J. Fu, Y. Wang and S. Zhang, *New J. Chem.*, 17:739–755, 1993.
30. N. R. Kallenbach, R. I. Ma and N. C. Seeman, *Nature*, 305:829–831, 1983.
31. A. Goffeau, *Nature*, News and Views, 385:202–203, 1997.
32. G. B. Birrell, D. L. Habliston, K. K. Hedberg and O. H. Griffith, *J. Histochem. Cytochem*, 34:339, 1986.
33. G. Danscher. *Histochemistry*, 71:81, 1981.
34. L. Scopsi and L-I Larsson, *Histochemistry*, 82:321, 1985.
35. L. Scopsi and L-I Larsson, *Medical Biology*, 64:139, 1986.
36. D. R. Springall, G. W. Hacker, L. Grimelius and J. M. Polak, *Histochemistry*, 81:603, 1984.
37. J. Teasdale, P. Jackson, C. S. Holgate and P. N. Cowen, *Histochemistry*, 87:185, 1987.

Acknowledgement of these references will be made by indicating these numbers from the above list.

BACKGROUND OF THE INVENTION

The miniaturization of microelectronics and logics, at current technology, is approaching its practical and theoretical limits. Various design and operational considerations such as heat removal, heterogeneity, connectivity as well as present photolitographic techniques restrict the practical size of minimal feature in present, semiconductor-based electronic components to about 0.25–0.3 μm. It is clear that further miniaturization of electronic components must involve new approaches and concepts for the fabrication of the electronic components and logic circuits.

Nanometer scale electronics needs to consider two fundamental issues: operating principles of the corresponding electronic components and schemes to fabricate such components and their integration into useful circuits.

A number of operation principles have been suggested based on charging effects[1-6] which become increasingly prominent as the device dimensions diminish. The construction of nanoscale circuits cannot be implemented by existing microelectronics technology. In particular, inter element wiring and electrical interfacing to the macroscopic world become increasingly problematic. Molecular recognition processes and self-assembly of molecules into supramolecular assemblies may be used for the construction of complex structure[5]. However, integrating electronic materials with these structures, or providing them with electronic functionality, has not yet been attained.

Nucleic acids possess self-assembly properties which can be used to form networks of nucleic acid fibers[27-30]. DNA has already been employed as an organizer of nano structures in the assembly of colloidal particles into macroscopic crystal-like aggregates[14,15] and in dictating the shape of semiconductor nano particle assemblies[16,17].

Glossary

In the following, use will be made with some terms, which terms and their meaning in the context of the invention are as follows:

Nucleotide chain—A sequence of nucleotides. The nucleotides may be ribonucleotides, deoxyribo-nucleotides, other ribo nucleotide derivatives, a variety of synthetic, i.e. non naturally occurring nucleotides e.g. peptide nucleic acid (PNA), as well as any combination of the above. The nucleotide chain may be single-stranded, double-stranded or multi-stranded.

Fiber—an elongated threadlike component. A fiber may have a polymeric or co-polymeric skeleton or may comprise stretches of different polymers or co-polymers linked to one another. A fiber may be chemically modified by depositing thereon one or more substances or particles. The fibers of the invention comprises at least one nucleotide chain. The fibers of the invention may also consist of nucleotide chains only.

Binding—A term to refer collectively to all types of interactions which bind together two or more molecules, substances, particles, supramolecular structures, etc., or brings to binding of these to a solid substrate. The binding may be covalent or non-covalent binding (non-covalent binding may include one or more of ionic interaction, hydrophobic interaction, Van der Waals interaction, chemical sorption, etc.). Derivation of this term (i.e. "bind", "bound", etc.) will have meanings commensurate to that of "binding", depending on the syntax.

Interaction—non-covalent binding of two molecular entities. Derivation of this term (i.e. "interact", "interacting", etc.) will have meanings commensurate to that of "interaction", depending on the syntax.

Functionalized nucleotide chain—A nucleotide chain which has been chemically or physically modified or attached with a substance, molecule, clusters of atoms or molecules or particles deposited thereon which impart electric or electronic properties to the nucleotide chain. Such substances or particles may be bound to the nucleotide chain by a variety of interactions (e.g. may be chemically deposited on the chain, may be complexed thereon by a variety of chemical interactions, may be associated with the chain by electrostatic or hydrophobic interactions, etc.). The substances or particles may be bound to the nucleotide chain based on the general chemical properties of the chain or may be bound to the nucleotide chain in a sequence specific manner. Examples of such substances, molecules, clusters or particles are: metal e.g. which gives rise to a conductive nucleotide chain; a variety of semi-conductive materials which can form conductors (or resistors), electronic p/n junctions, and others; molecules, clusters of molecules or particles which can be associated with the nucleotide chain to form functional logic junctions between nucleotide chains; etc. Depending on the type of bound substances or particles, the electric or electronic properties imparted to the nucleotide chain may be conduction, insulation, gating, switching, electrical amplification, etc.

Functionalized fiber—a fiber which has been chemically or physically modified or attached with substances, clusters of atoms or molecules or particles deposited thereon which impart electric or electronic properties to the fiber or a part thereof. An example of a functionalized fiber is a fiber whose nucleotide chain has been functionalized.

Junction—A point of connection of two or more fibers to one another. Examples of junctions can be seen in FIGS. 2A–2F (please refer to the description below relating to this figure).

Network—A geometrical one, two or three-dimensional structure which comprises at least one fiber and may comprise other components such as particles, molecules, e.g. proteins, other macromolecules and supramolecular complexes, etc. The term "network" may refer to the geometrical arrangement of the fibers and junctions between them. This term may also be used, at times, to refer to a functionalized network (see below).

Functionalized network—a network comprising at least one functionalized fiber. The functionalized network has properties defined among others, by its geometry, the type of connectivities and junctions between different fibers, by the nature of the deposited or complexed substances or particles, etc.

Electronic functionality (or electronically functional)—A property of a component which renders it to serve as an electronic component.

Interface component—A conducting substrate, which may be made of metal or of any other conducting material or coated by metal or such conducting material, which serves for connection of said network to external electronic or electric components or circuitry, thus serving as an input/output (I/O) interface with an external component or circuitry. The interface components are linked to the network on the one hand and are electrically linked to an external component or circuitry, on the other hand. The interface component, may at times also be referred to herein as "electrode".

Wire—In the context of the invention—a functionalized fiber with bound substance or particles which give rise to electric conductivity along the fiber. The wires are conducting components which may interconnect two or more sites of the network, connect the network with an electrode, connect between two networks, etc. A wire may extend an entire length of a functionalized fiber or may extend only part of the length of a functionalized fiber, with other parts serving as base for various types of electronic components, e.g. a diode, an electric switch, etc.

Insulator—A component of a network which acts as a barrier for electric conduction.

Conductor—a component of a network which permits change transfer therethrough.

Switch—A two or multi terminal component where the conductance between any pair of terminals can be turned on or off by a control signal including, for example, the potential at another terminal, light, pressure, chemical reaction, stress, etc.

Electronic component—Any component which may form part of an electronic network other than a wire or a simple junction between wires (a simple junction being a junction having the purpose of only providing a link between fibers or functionalized fibers). An electronic component may be a conductor, an insulator, a switch, a transistor, a diode, a light emitting diode, a capacitor, an inductor, and others.

Network component—a term referring collectively both to a wire and to an electronic component.

External circuitry, external component—An electronic or electric circuitry or an electronic or electric component, respectively, situated electrically external to the network and typically comprises prior art electric or electronic components, including standard solid-state microelectronic components.

Linker—An agent (molecule, complex of molecules, supermolecular structure, macromolecule, aggregate, colloid particle, molecular cluster, etc.) that acts in providing a physical link between network components or between the network and the interface component. The linkers may have chemical groups for covalent or non covalent binding, (e.g. complexation or sorption, etc.) to the network components or to the interface component. Examples of a linker are: a nucleic acid binding protein; synthetic molecules with a binding ability to a specific nucleic acid sequence; a short, single or multiple stranded nucleic acid sequences (e.g. an oligonucleotide), e.g. having a "sticky end" and being modified at its other end, to allow it binding to the interface component; a group comprising one member of a binding couple for binding to another group or component carrying the other member of the binding couple (a binding couple being a pair of molecules which specifically interact with one another such as antigen-antibody receptor-ligand, biotin-avidin, sugar-lectins, nucleotide sequence-complementary sequence, etc.).

Complexing agent—An agent which is used for binding of components of the network to one another. The binding may be covalent or non covalent. Examples of complexing agents are: proteins with a specific binding ability to a nucleic acid sequence; oligonucleotides; synthetic molecules which can bind to two components; etc. An example of use of a complexing agent is in linking of an end of a nucleic acid fiber to a colloid particle or linking of the two nucleic acid fibers to one another, for the purpose of creating a junction.

SUMMARY OF THE INVENTION

The present invention makes use of the molecular recognition properties and self-assembly processes of nucleic acid sequences and other components. These features are used to prepare fiber-based networks with a geometry defined by the type of interconnectivity between nucleotide chains of the fibers. The fibers may be made of nucleotide chains. Alternatively, the fibers may be made of substances other than nucleotide chains but comprising one or more nucleotide chains, and may be connected to other network components through such chains. The fibers may be wholly or partially a priori conductive, but are typically chemically or physically modified so as to have electric or electronic functionality. The functionalized network may include conductors, switches, diodes, transistors, capacitors, resistors, etc.

The present invention provides, by a first of its aspects, an electronic network with at least one network component, the network having a geometry defined by at least one fiber comprising one or more nucleotide chains.

The network component may be a conductor, e.g. a wire, or may be an electronic component.

The fibers of the invention can form junctions in which one nucleotide chain segment of one fiber is bound to another nucleotide segment of another fiber by a sequence-specific interaction. Alternatively, junctions may be formed between nucleotide chains of different fibers, by a molecule, cluster of atoms or molecules or a particle which is bound to each of the nucleotide chains in the junction. Such a molecule, cluster or particle may be bound to the nucleotide chains through linkers bound to said molecule, cluster or particle.

The junction may also be formed by modified nucleotides, for example, modified such to allow covalent binding of at least one nucleotide of one chain to a nucleotide of another chain. An example of such modification is the addition of a sulfur an amine residue, a carboxyl group or an active ester. The chemical modification of a nucleotide may also allow a chain to bind a linker, to bind to a particle, to bind to an electronic component of the network, etc. The nucleotide chain may also be modified by binding thereto one member of a binding couple for binding to another component comprising the other member of the binding couple. The binding couple consists of two molecules or moieties which have a specific affinity towards one another. Such binding couples include biotin-avidin biotin-streptavidin, receptor-ligand, dig-antidig, antigen-antibody, sugar-lectin, nucleotide sequence-complementary sequence, and a nucleotide chain and a nucleotide binding protein. Typically, at least one nucleotide chain of the network has one or more substances or at least one cluster of atoms or molecules or particle bound thereto or complexed therewith such that at least one electric or electronic component is formed with properties which are based on electric charged transport characteristics of said one or more substances or at least one cluster of atoms or molecules or particle.

The electronic component in the network is electrically connected to at least one fiber and is constructed either on a nucleic acid chain which has been chemically or physically modified by depositing one or more molecules, clusters of atoms or molecules or particles thereon, rendering the chain to have electronic functionality, or being constructed by a molecule, cluster of atoms or molecules or a particle situated at a junction between two or more nucleic acid chains of different fibers, rendering said junction to assume electronic functionality. The electronic functionality is based on electric charged transport characteristics of the one or more molecules, cluster of atoms or molecules, or particles. Electronic functionality may also at times depend on junction geometry.

The network is typically connected to interface components (electrodes) which serve as an input/output (I/O) interface between the network and the external electronic circuitry or component.

According to one embodiment of the invention, the fibers have a nucleotide skeleton which has been chemically or physically modified, by depositing thereon or incorporating thereto one or more molecules, cluster of atoms or molecules or particles to render it electronically functional. The fibers, in addition to comprising one or more nucleotide chains, can also be substantially made (other than its nucleotide chains) of a variety of substances such as conducting or semi-conducting polymers, other polymers which have been modified to render them electrically or electronically functional (e.g. by depositing thereon molecules, cluster of atoms or molecules or particles) or carbon nano-tubes.

Molecules, clusters of atoms or molecules, or particles, used for either chemical or physical modification of the fibers or within junctions between fibers, may typically comprise or be made of one or more metal atoms, which impart charge transport characteristics onto said cluster or particle.

The skeleton of the network of the invention comprises acid fibers which are assembled to form a network on the basis of their sequence specific interaction with other fibers or specific binding to other components. In this manner networks with practically infinite variety of geometries can be formed.

Substances or particles may be bound to the fibers based on their general (overall) chemical properties. This will typically yield a substantially homogeneous deposition of the substance or particles along the fiber. A specific embodiment of such a homogeneous binding of substances or particles is the formation of an electrical conducting wire on the nucleotide chain skeleton, e.g. where the conducting substance is metal, such as described below. Alternatively, substances or particles may also be bound to the nucleotide chain in a sequence or domain-specific manner in different portions of the fibers, namely in a manner which depends on the sequence of nucleotides at given portions of the nucleic acid chains.

Sequence or domain-specific deposition of substances at different nucleotide chain portions may be performed in a number of different ways. For example, an oligonucleotide a priori bound to a certain electronically functional substance or particle, may be made to bind onto a chain portion with a complementary sequence. Similarly, it is possible also to bind different types of substances or particles, in a sequence or domain-specific manner, also to a multi-stranded (e.g. double-stranded) nucleic acid fiber. This may be achieved, for example, by the use of a sequence-specific complexing agent which identifies and binds to a specific site of a double-stranded nucleic acid chain. The complexing agent may be an oligonucleotide, forming with a double-stranded chain, a triple-stranded structure; a protein, e.g. a DNA-binding protein recognizing a specific double-stranded domain; and many others.

By sequence or domain-specific binding, different types of substances may be bound to different portions of a given fiber or network of fibers.

Particles, e.g. colloid particles or polymers, may be made to bind to one or more fibers, typically by the use of complexing agents or linkers. Depositions of such particles may be utilized for the formation of electronic components, e.g. a single-electron transistor (SET).

The geometry of the network is defined by the fibers. In formation of the network the chemical complementary and molecular recognition properties may be utilized by employing a self-assembly process. The fibers may be assembled to form the network by sequence-specific interactions of the nucleotide chain with complementary sequences. This may be used for the formation of various junctions (e.g. T- or X-junctions, as exemplified in FIGS. 2A–2F and others). Specific molecular recognition between nucleic acid chains and linkers or complexing agents (the linkers or complexing agents may be oligo-nucleotides or a variety of other molecules, macromolecules, supramolecular assemblies or particles) may be used to link the nucleic acid chains to interface components or to other network components, e.g. to particles situated at junctions between fibers.

The present invention also provides, as one of its aspects, a junction between two or more conductors of a micro electronic network, wherein each of the conductors has an end segment proximal to the junction comprising a nucleotide chain bound to another chain within the junction.

The invention also provides, by another of its aspects, a method for making an electronic network, comprising:

(a) providing an arrangement comprising at least one electrically conductive interface component;

(b) attaching a linker to the at least one interface component;

(c) contacting said arrangement with at least one fiber comprising at least one nucleotide chain with a sequence capable of binding to the linker, and permitting binding of said sequences to said linker, (d) electrically or electronically functionalizing the at least one nucleotide chain by depositing thereon or complexing thereto at least one substance or particles imparting electric or electronic functionality to the fibers.

It should be noted that the order of steps in the above method is not material and may be changed. For example, step (c) may precede step (b), or the functionalizing step (d) may precede step (c).

The network may at times be formed at once by mixing all components in a medium and then allowing the components to self-assemble in a specific manner, based on the pre-designed properties of the various components. Fibers may be designed to have specific nucleic acid sequences to allow their hybridization to complementary sequences in other fibers. Similarly, particles may be formed with specific, sequence or domain-recognizing complexing agent bound thereto, to allow them to bind to nucleic acid chains in a sequence or domain-specific manner. For example, clusters or particles with three different oligonucleotides bound thereto can be formed which will then bind to ends of three different nucleotide chains, to form a junction between the three fibers containing a colloid particle. Similarly, in order to ensure binding of the network to the interface components in a specific manner, sequence- or domain-recognizing linkers may be immobilized on the interface components and brought into contact with the assembling network.

At other times the network may be formed in a sequential manner, e.g. first forming a first sub-network structure comprising part of the components of the complete network and then the missing components (e.g. fibers, particles, etc.) may be sequentially added until the network is completed. Sub-network structures may, for example, be particles with several oligonucleotides connected thereto, branched-fiber structures, etc. The gradual assembly may also be based on the self-assembly properties of the nucleotide chains and of complexing agents and linkers which bind to the nucleotide chains in a sequence or domain-specific manner. Furthermore, it is also possible, particularly in the case of networks with a complex structure, to first prepare a plurality of sub-network structures and then combine them for the formation of the complete network.

As will obviously be appreciated by the artisan, the formation of the network may be aided by agitating the medium where the network is formed, by providing directional streams of fluid to orient the fibers to connect to a downstream network component at their other end, by applying other biasing measures, etc. In forming wires of the inventions, electric potential between the two ends of the fiber on which the wire is formed, may enhance and provide directional deposition of a conducting substance, e.g. metal.

The nucleotide chains, which may be a priori single, double or multiple stranded, may be formed and replicated by a variety of methods including recombinant DNA methods involving production and reproduction of nucleic acid fibers by "engineered" cells, e.g. microorganisms; alternatively, the fibers may be produced synthetically, e.g. by synthesis of strands and then combining them into larger fibers. The fibers may be formed by a variety of amplification techniques, e.g. polymerase chain reaction (PCR); etc.

Fibers constructed of nucleotide chains and other substances may be formed in a variety of ways. Typically, a non-nucleic acid fiber (e.g. made of a conducting polymer or being a carbon nano-tube) may be formed and covalently bound at both ends to specific nucleotide chains. Such a fiber comprising a non-nucleotide fiber bound at its two ends to a nucleotide chain may be used as such in constructing the network. The fiber may be extended by binding to other stretches of nucleotides, by binding to combined nucleotide-non-nucleotide fiber to obtain a longer fiber with intermitted nucleotide chains and non-nucleotide stretches, etc.

As will be appreciated, rather than binding a chain at an end of a non-nucleotide fiber, only a precursor may be bound and then the chain synthesized in situ beginning with the precursor.

The non-nucleotide fiber stretches are typically a priori conducting or semi-conducting, e.g. made of a conducting or semi-conducting polymer or co-polymer or a conducting nano-tube. In such cases no additional functionalization of such non-nucleotide fiber stretches may be needed. However, the non-nucleotide fiber stretches may also be made a priori non-conducting and can then be functionalized to become electrically or electronically functional by doping or by chemical or physical deposition thereon of a variety of molecules, clusters or particles, e.g. those described above.

By an additional aspect the invention provides a junction between an electronic component of an electronic network and an electrically conducting interface component, comprising a nucleotide chain attached to one of the electronic components or to the interface component and bound by a biomolecular interaction to a linker attached to the other of the two components.

By a still further aspect of the invention there is provided a network component as defined above. Examples of network components which may be formed in accordance with the invention are a switch, bipolar transistor, single-electron transistor, field effect transistor, diode, capacitor, resistor, conductor, light emitting diode, insulator, inductor.

While the above network components are useful within the network of the invention, some may at times have utility in different applications. Their small size as compared to corresponding prior art components, allows them to be utilized in a variety of applications requiring a small size or low energy consumption. A particular example of such a component is a wire.

A wire of the invention may be made to be very thin and may be used to advantage in application requiring thin wires, for example, as a gate in a semi-conductor field effect transistor (FET) for a very fast gating of such a transistor. The gating speed of a FET depends to a large extent on the width (referred to in the art at times as "length") of the gating wire in the FET. The wire in accordance with the invention may be made to be about two orders of magnitudes smaller than the width of prior art gate wires of FETs, and accordingly, fast modulation, faster than hitherto possible, can be obtained in a FET using a wire of the invention. A FET comprising a wire of the invention as its gate is also an aspect of the invention.

The invention will now be illustrated by the following detailed description and subsequent examples, with occasional reference made to the annexed drawings. It should be appreciated by the artisan, that the invention is not limited to the specifically described embodiments but rather applies to the fill scope of the invention as defined above, namely, to the formation of a network, and components in the network, by employing self-assembly properties of nucleic acid fibers and by deposition or complexation of substances or particles onto or to the fibers using molecular recognition driven, self assembly process, to render the fibers or junctions between the fibers electronically functional.

BRIEF DESCRIPTION OF THE DRAWINGS

FIGS. 3A–3B represent the manner of forming and functionalizing a nucleic acid chain into a wire, with the conducting material being silver (the wire's skeleton consists of nucleotides).

FIGS. 4A–4B represent the manner of forming a wire on a nucleotide skeleton, where the electronic material is polyphenylene vinylene (PPV).

FIGS. 7A–7B are illustrations of a molecular switch in accordance with an embodiment of the invention.

FIG. 9 illustrates the manner of forming two oligonucleotide chains at both ends of a polythiophene fiber.

FIG. 10 illustrates the manner of attaching the derivatized oligonucleotides to carboxylic groups formed at the end of non-nucleotide fibers.

FIG. 11 illustrates a manner of derivatizing terminal groups of carbon nano-tubes using amino derivatized oligonucleotides.

DETAILED DESCRIPTION OF THE INVENTION

Figure 1B:
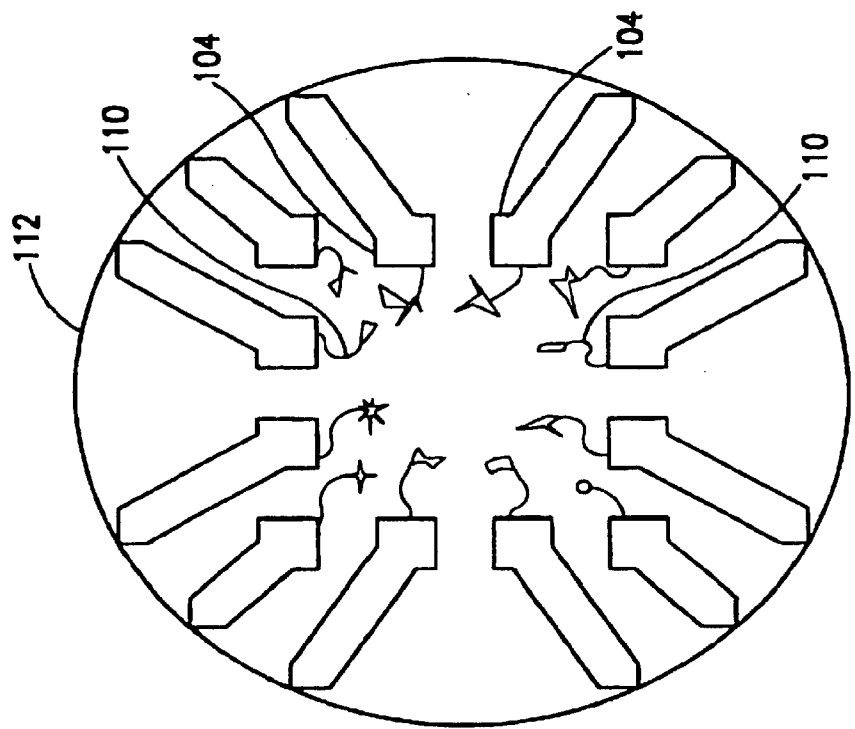
FIGS. 1A–1B show a matrix of interface components and linkers for binding to the network of the invention on the one hand and connecting to external electronic circuitry or components on the other hand.
Figure 1A:
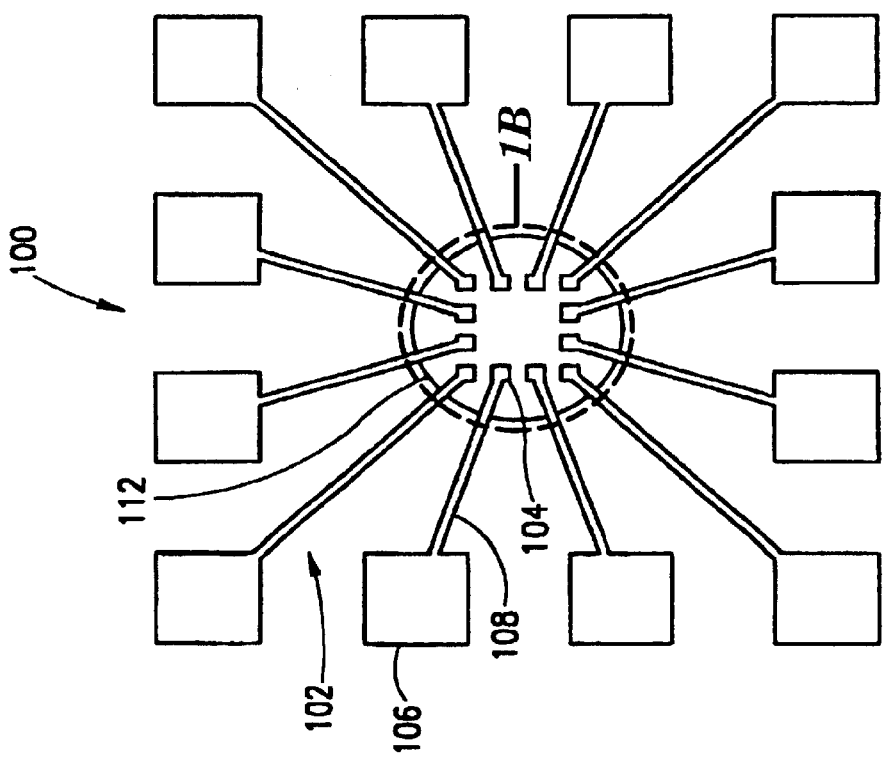

The formation of a network typically begins by providing a matrix of interface components, which provide the I/O interface between the network and an external circuitry or external component. Illustration of one embodiment of such an interface component matrix 100 is shown in FIGS.

1A–1B. Each of the interface components 102 is typically a metal electrode having a network-connecting pad 104, and an external circuitry connecting pad 106 linked by a connector portion 108.

As a preparatory step for the formation of the network, the connecting pads are treated to allow binding thereto of linkers 110, e.g. derivatized oligonucleotides, as shown in FIG. 1B. Examples of the manner of treatments are described below. (One embodiment of the manner of immobilizing a linker oligonucleotide onto an interface component in seen in FIG. 1C and described below). Pre-prepared linkers 110 can then be attached to the pad 104, typically a different linker to each of the pads. The linkers 110, shown in a schematical manner in the enlargement at the right of the central portion 112 of the matrix, may be immobilized onto pads 104, for example, by jet printing, e.g. in the manner described below in the Examples. In this manner, a different linker 110 may be attached to each of pads 104. Each of linkers 110 may have a selective binding ability to a different specific nucleic acid sequence, this feature being represented by the different shapes at the end of the linkers.

A network of functionalized fibers including wires (as herein defined and described, by way of example, below) and a variety of other network components formed on or at junctions between the fibers, can then be contacted with the matrix; the specific binding of nucleic acid sequences in the network's fibers to the linkers immobilized onto the interface components results in a specific connectivity pattern of the network to the interface components. Alternatively, nucleic acid chains of the fiber may first be made to specifically bind to the linkers and, if required, the functionalization of the networks, i.e. the formation of electronically functional components, the formation of wires, etc., may then be carried out in the formed nucleic acid-based network. Another alternative would be to first anchor several sub-network structures to the matrix of interface components and at a subsequent step, or simultaneously, allow the sub-network to bind one another to form a complete network. Examples of sub-network structures include several fibers connected together, particles or clusters of atoms or molecules with several nucleic acid fibers attached thereto; etc. Here again, the fibers may be a priori electrically or electronically functional (wholly or partially) or the functionalization may be carried out after formation of the network.

Figure 1C:
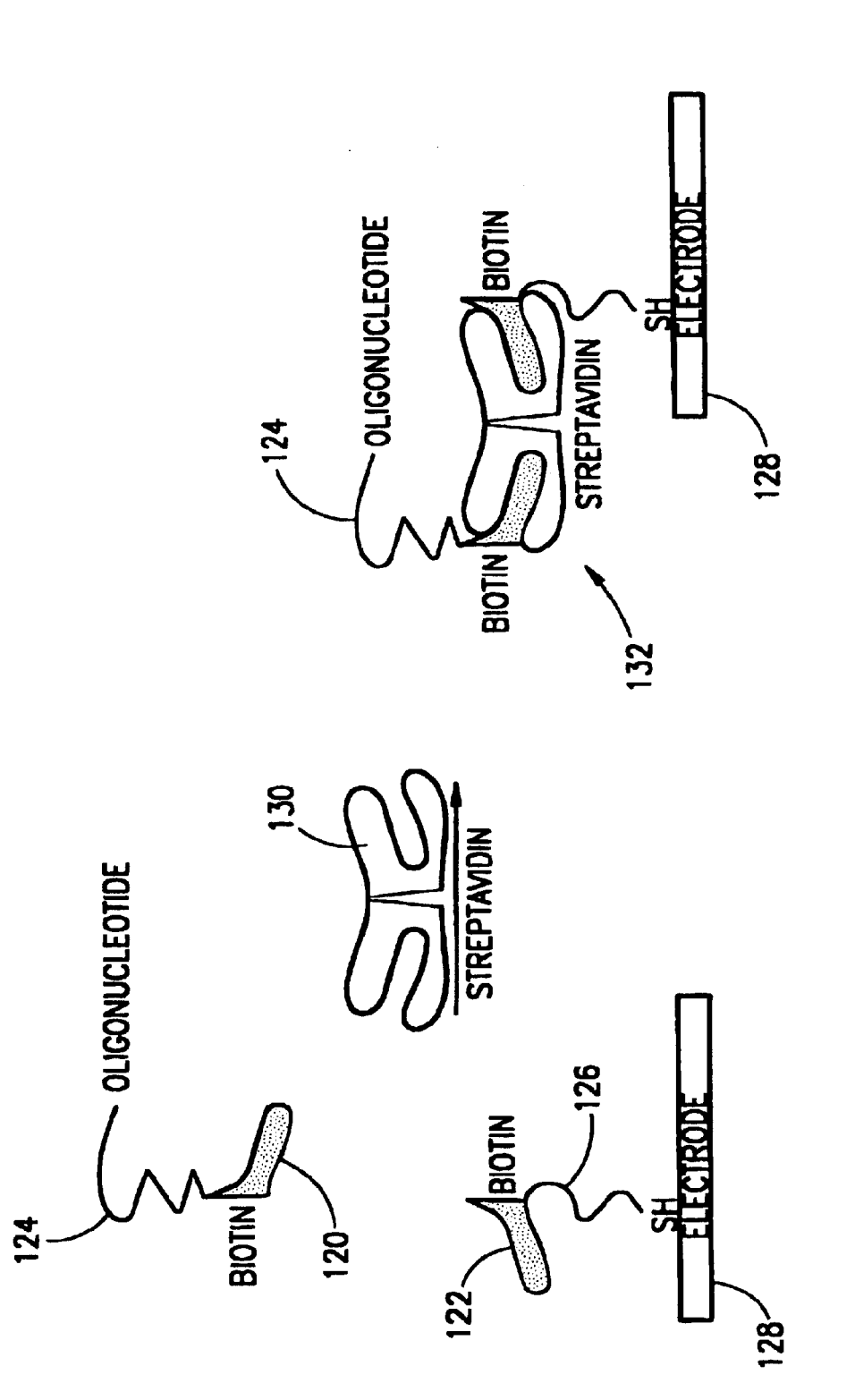
FIG. 1C illustrates an embodiment of immobilization of oligo-nucleotide linkers onto the interface components.

FIG. 1C is a schematic representation of one embodiment for immobilizing an oligonucleotide onto an interface component. Biotin molecules 120 and 122 are bound, one to an oligonucleotide 124 and the other to a sulfur containing moiety 126. Biotin molecule 122 is immobilized onto interface component 128 through the sulfur containing moiety 126 and then when streptavidin molecules 130 are introduced into the medium, they yield the formation of a complexing agent 132, which is a supramolecular complex comprising biotin and streptavidin, which immobilizes oligonucleotide 124 onto interface component 128.

Oligonucleotide 124 may be modified, by a subsequent functionalization step, into a network component such as a conductor, a diode, a transistor, etc., in a manner to be exemplified below. Alternatively, they may serve as linkers for binding of a nucleotide-chain end segment of a fiber.

Figure 2A:
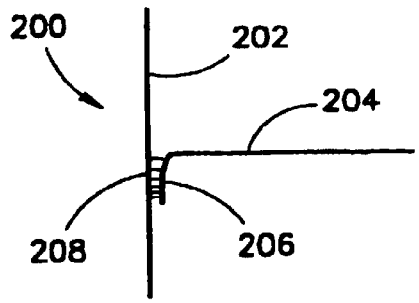
FIGS. 2A–2F show six examples of junctions between nucleic acid chains.

Important components in the network of the invention are junctions which serve a variety of functions. Several examples of junctions are shown in FIGS. 2A–2F. FIG. 2A depicts a junction 200, formed between two single-stranded nucleic acid fibers 202 and 204. The junction, in this specific example is formed by hybridization of a terminal end sequence 206 in fiber 204 and a complementary sequence 208 in fiber 202. This junction may serve as a T-type junction between nucleic acid fibers which can then be transformed into functionalized connecting junctions by depositing an electrically conducting substance on fibers 202 and 204 and junctions, e.g. in the manner to be described below.

Figure 2B:
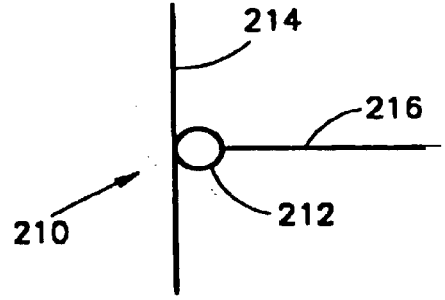

Another type of junction 210 is shown in FIG. 2B. This junction is formed by a complexing agent 212 which may be a colloid particle, a protein, another type of a macromolecule, a supramolecular structure, etc. In this case, the junction is formed between one single-stranded fiber 214 and another single-stranded fiber 216. However, it should be appreciated that such a junction may also be formed between two double-stranded fibers. The complexing agent may be bound to the fibers by a variety of means. The binding may be covalent or non-covalent. Examples of non-covalent binding are ionic interactions, hydrophobic interactions, by means of Van der Waals forces, etc. The complexing agent may also be a complex molecular structure by itself, e.g. it may be formed by two or more molecules or macromolecules with a binding affinity to one another of which at least one is bound to each of fibers 216 and 214. Examples of such complex molecular structures are a large variety of molecules which can bind to one another, such as for example: antibody-antigen, ligand-receptor, biotin-avidin, and many others.

A specific example of such a complex molecular structure is shown in FIG. 1C (above). Although this complex molecular structure, which is a biotin-streptavidin complex, is shown in its role as immobilizing oligonucleotide onto an electrode, the same complex molecular structure may also be used for forming a junction between nucleic acid fibers (i.e. each fiber will be modified by binding a biotin and then the two avidin moieties may be complexed by one streptavidin).

Figure 2C:
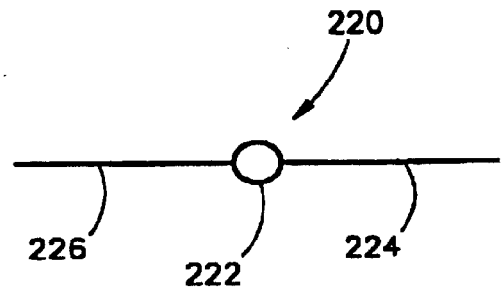

A further example of a junction 220 is shown in FIG. 2C. In this case, a complexing agent 222 binds together two fibers 224 and 226. The complexing agent and the manner of its interaction with nucleic acid fibers may be similar to complexing agent 212 in FIG. 2B.

Figure 2D:
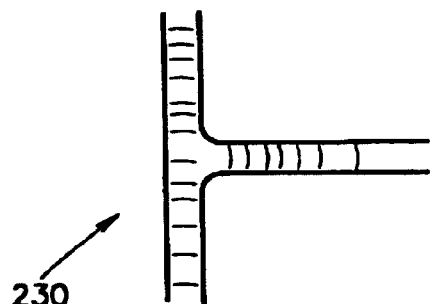
Figure 2E:
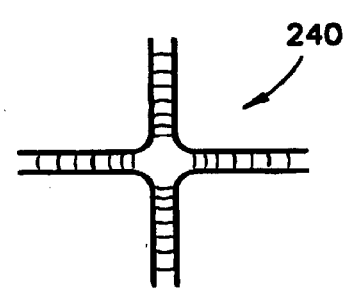

Two other examples of junctions are shown in FIGS. 2D and 2E. These junctions 230 and 240 are formed between three and four nucleic acid chains, respectively, each of which is double-stranded. Such junctions may be formed by hybridization or enzymatic synthesis, as described below in the Examples.

Figure 2F:
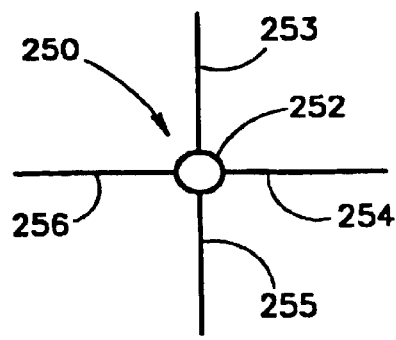

Another type of junction 250 is shown in FIG. 2F. In this case, a complexing agent 252, e.g. a colloid particle, links together a plurality of fibers, four 253–256 in this specific embodiment, each of which is bound at its terminal to the complexing agent 252. The binding of each of fibers 253–256 to particle 252 may be by means of direct association, by the use of mediators such as specific binding proteins, in any of the manners described in connection with FIGS. 2B and 2C, etc.

In the following, some examples of fabrication of wires and electronic components and functionalized networks of the invention will be described. It should be understood that these are exemplary embodiments only and various modifications of the described embodiment are possible, all being within the scope of the invention as defined herein.

Figure 3A:
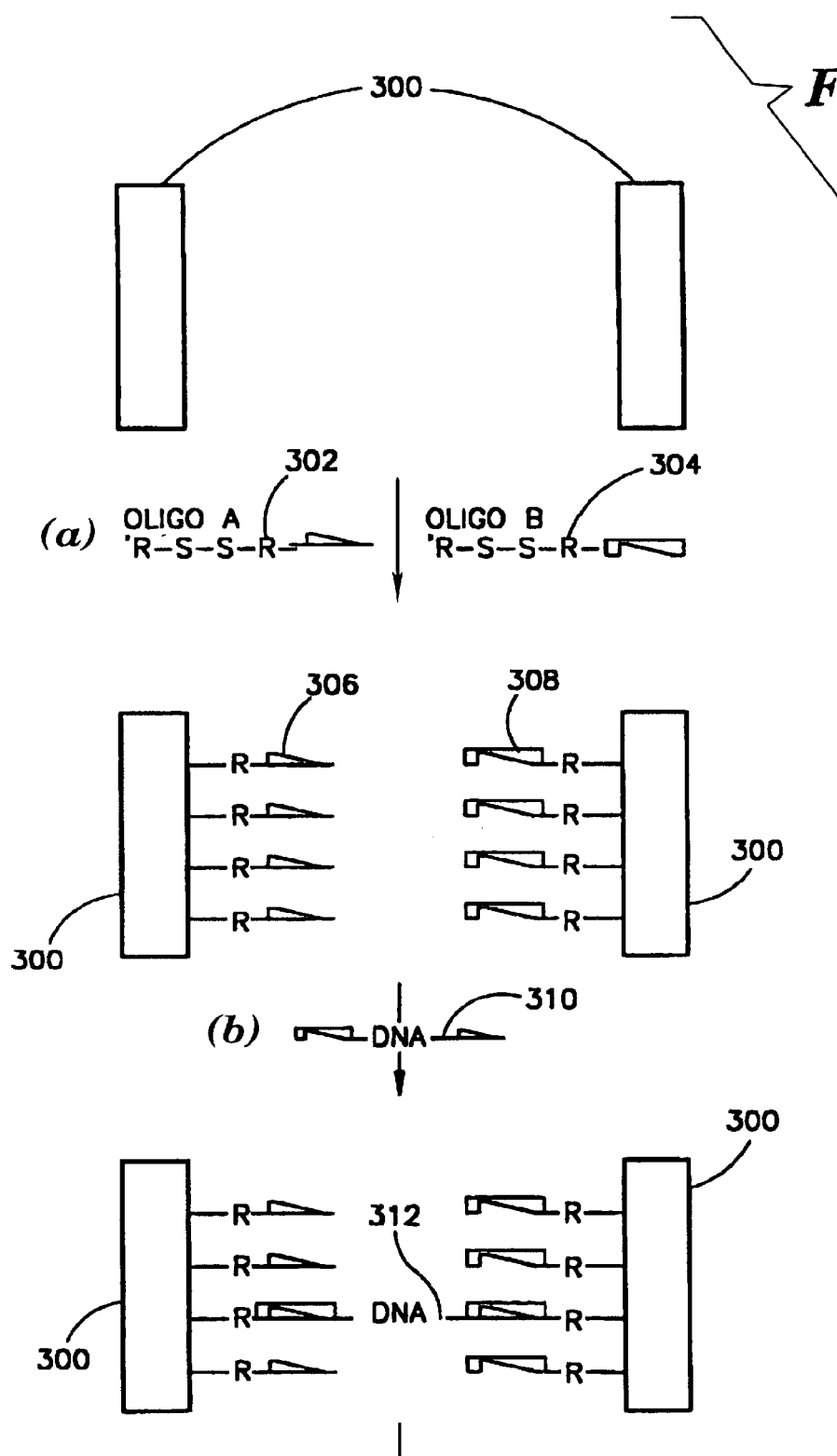

Reference is now being made to FIGS. 3A-3B, showing the manner of formation of a wire in accordance with an embodiment of the invention which in this specific case is a wire formed on a nucleotide skeleton. As illustrated in FIG.

3A, the wire here is formed between two electrodes 300, typically made of, or coated by metals such as gold, platinum, silver, etc. Electrodes 300, which may be first treated in a manner to facilitate subsequent binding of the linker, are wetted separately with a solution containing either linker molecules 302 or 304, each consisting of a single-stranded oligonucleotide ("Oligo A" and "Oligo B", respectively), derivatized by a disulfide group. When these linkers are deposited on electrodes 300, under appropriate conditions, the disulfide group bind to the electrodes 300, to form linkers 306 and 308, respectively (step (a)). Electrodes 300 are then wetted with a nucleotide chain solution, e.g. a DNA double-stranded fiber, 310, having sticky ends, complementary to the sequences of the oligonucleotides in linkers 306 and 308. Electrodes 300 are spaced from one another at a distance about equal to the length of the nucleic acid fiber 310, whereby each end of nucleic acid fiber 310 binds to its complementary oligonucleotide in one of linkers 306 and 308 to form a bridge 312 between the two electrodes 300 (step (b)). By controlling the concentration of oligonucleotide 310 in the medium, the number of such bridges formed between the electrodes can be controlled. Following hybridization the binding of the linkers to the nucleic acid fibers may be strengthened by covalent binding of the two to one another by ligation of the nicks.

At times, particularly where fiber 310 is long and thus it is not practical to ensure its hybridization at both ends merely by relying on diffusion, the strand 310 may be made to connect to one electrode and then, by a directional stream of fluid from the first electrode to the second, the nucleic acid fiber is made to extend so that its end reaches the second electrode.

It is also clear that in order to avoid folding of the nucleic acid fibers and to ensure proper binding, appropriate solutions may need to be at times selected.

The functionalization step of the fiber, for the purpose of constructing a metal wire, begins, according to the specifically illustrated embodiment as shown in FIG. 3B, by an ion exchange step involving exposure of the fiber to a solution comprising silver ions ($Ag^+$) under alkaline conditions, whereby the silver ions replace the sodium ions or other ions normally associated with the nucleotide chain and complex with the negatively charged fibers (step (c)). This gives rise to a nucleic acid fiber 314 loaded with silver ions 316. It should be noted, that rather than silver ions, a wide variety of other metal ions can be used, including for example, cobalt, copper, nickel, iron, gold, etc. Furthermore, metal aggregates, complexes or clusters, e.g. colloidal gold, colloidal silver, etc., may also be deposited on the nucleic acid fiber via a variety of different interactions. The ion-exchange step typically involves rinsing of the fibers with deionized water, and then soaking them in a solution of the metal ions or metal aggregates.

At a next step (step (d)), the fiber is exposed to a reducing agent, e.g. hydroquinone, which yields a reduction of the metal ions in situ into metallic silver. The metallic deposit, e.g. metallic silver, is formed at a number of nucleation sites 318. After rinsing with deionized water, the fibers with nucleation sites 318 are contacted with a reagent solution comprising metal ions and a reducing agent, e.g. hydroquinone, under acidic conditions. Under these conditions, the ions are converted to metallic metal only at the nucleation site and consequently the nucleation centers grow to form a conductive wire 320 (step (e)).

It should be noted that the silver nucleation centers can also be enhanced by chemical deposition of gold or other metals. Similarly, gold nucleation centers may be enhenced by deposition of gold, silver as well as other metals.

The so formed wire 320 may be subjected to a variety of post fabrication treatments, which may include, for example, thermal treatment intended to increase the wire's thickness and homogeneity; passivation treatment for the purpose of forming an electrically insulating layer around the wire, e.g. by exposure to alkane thiol; electrochemical or photochemical growth of the wire by polymers on the wires; etc.

Figure 3C:
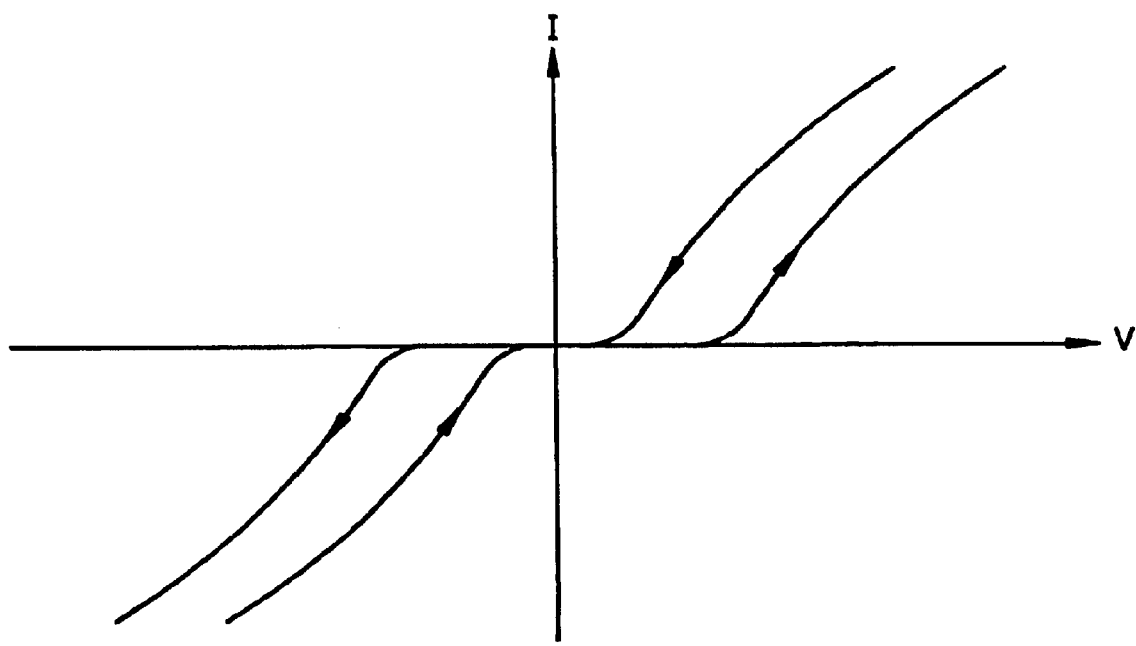
FIG. 3C shows a possible current-voltage relationship of a wire formed as illustrated in FIGS. 3A–3B, which is dependent on the voltage scanning direction (presented by arrows on the curves).

FIG. 3C illustrates a typical current-voltage relationship of a wire formed by the procedure illustrated in FIGS. 3A–3B. As can be seen, the curves are non linear and are asymmetric with respect to zero bias. The shapes of the curves depend on the scan direction as indicated by the arrows in FIG. 3C. Approaching zero voltage from a large positive or negative bias, the current vanishes almost linearly with the voltage. A zero current plateau then develops with very large differential resistance. At a higher bias, the wire turns conductive again with a different channel resistance. This history-dependent current-voltage relationship, may render the wire as a logic or memory component.

As may be appreciated, in a similar manner, mutatis mutandis, fibers of the kind shown below in FIG. 8A may be prepared. The required functionalization step may then only be needed with respect to the terminal or intermediate nucleotide chains.

Figure 4A:
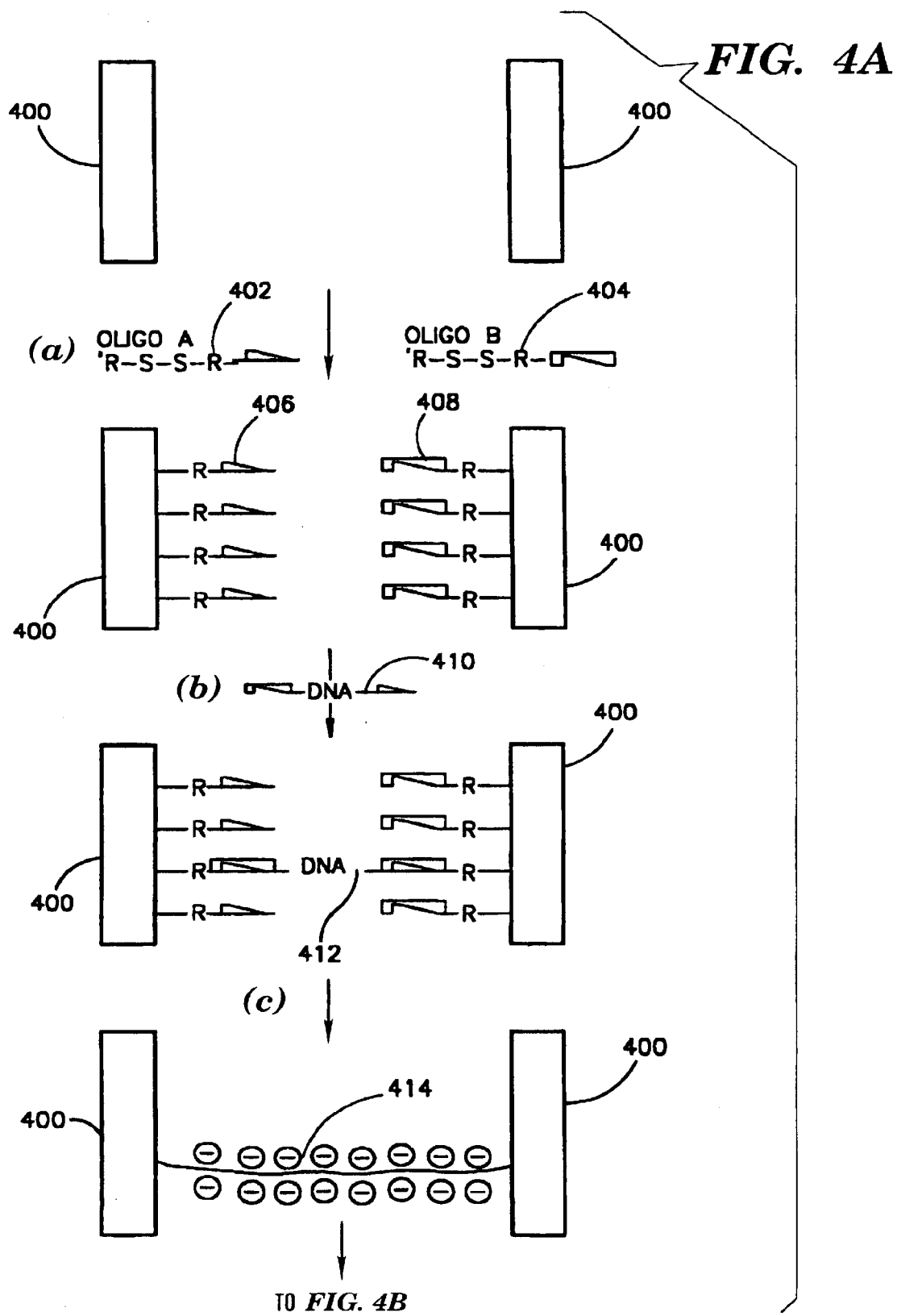

Reference is now being made to FIGS. 4A–4B, showing the manner of formation of a wire in accordance with another embodiment of the invention. Here again the wire is formed on a nucleotide skeleton. As pointed out above, with reference to the embodiment of FIGS. 3A–3B, a similar procedure, mutatis mutandis may be followed with respect to a fiber of the kind shown in FIG. 8A. In the embodiment shown in FIG. 4A, in distinction from that of FIG. 3A, rather than metal, the deposited material is PPV (poly-phenylene vinylene). Electrodes 400, may be the same as electrodes 300 shown in FIG. 3A. The first two steps of the method (steps (a) and (b)), are substantially identical to the corresponding steps in FIG. 3A (identical components have been given a reference numeral with the same last two digits as the corresponding components in FIG. 3A: e.g. 402 is the same as 302, 404 as 304, etc.). The formed bridge 412 may be strengthened, similarly as above, by covalent binding of fiber 410 to linkers 406 and 408 to yield a complete fiber 414 connecting the two electrodes (step (c)).

As shown in FIG. 4B, a solution comprising pre-PPV[26] molecules 416 is then contacted with fiber 414 and by the virtue of being positively charged, pre-PPV 414 becomes complexed with the negatively charged DNA bridge 414 (step (d)). At a next step, the sample is rinsed, dried and finally heated in a vacuum, e.g. to a temperature of about 300° C., for about 6 hours, which leads to the release of tetrahydrothiophene groups and hydrochloric acid from each repeat unit, yielding a luminescent PPV component (step (e)).

In order to convert the PPV into a conductor, this polymer is doped with agents which either cause electron deficiency (holes) or give rise to extra electrons. Doping may be performed by many known methods e.g. exposure to $H_2SO_4$ vapor, addition of halo-acid vapor (e.g. HCl, HBr), by the use of dodecyl benzene sulfonic acid, by the use of camphor sulfonic acid, or by other means. The extent of doping determines the conductivity of the wire.

Many other polymers may be used instead or in addition to PPV in accordance with the invention. This includes a variety of polymers with positively charged side groups as well as polymers with positively charged groups in the backbone or polymers with recognition groups capable of binding to nucleic acid fibers. Another example of a polymer is polyaniline (PANI). These polymers include such which have either an electron deficiency (p-type polymers) or have electron surplus, (n-type polymers). In addition in a similar manner, mutatis mutandis, other types of conducting substances (n-type or p-type substances) may be bound to the fiber.

By the use of oligonucleotides bound to various substances which can impart electronic functionality, the properties of the electronic components assembled on a nucleic acid fiber can be precisely controlled. For example, two oligonucleotides, of which one has a sequence to allow hybridization to a specific portion of the fiber, and is bound to a p-type substance, and another has a sequence allowing hybridization to an adjacent portion of the fiber, bound to an n-type substance, (a polymer with an electron surplus) are made to bind to the fiber, and in this manner, an n/p junction can be formed, e.g. serving as a diode. Another example may be the formation of a p-n-p or an n-p-n type, bipolar transistor.

Figure 5A:
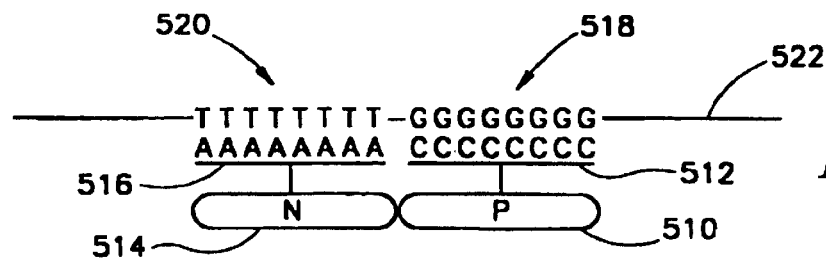
FIGS. 5A–5E show a number of examples of functionalized nucleotide chains consisting of a p/n junction (FIGS. 5A–5C), a graded p/n junction (FIG. 5D) and a bipolar n-p-n transistor (FIG. 5E).
Figure 5B:

An example of some functional components which may be formed on a nucleotide chain are shown in FIGS. 5A–5E. In FIG. 5A, a p/n junction is formed by a p-type substance 510 bound to one oligonucleotide 512, which is a poly C in this specific example, and an n-type substance 514 bound to another oligonucleotide sequence 516, a poly A in this specific example. The oligonucleotides bind to complementary sequences 518 and 520, respectively, on the nucleotide fiber 522 and after coupling, a p/n junction is formed. In FIG. 5A, the p/n junction is formed on a single-stranded segment of fiber 522. Similarly, such a junction may also be formed on a double-stranded fiber 524 (see FIG. 5B), e.g. by first removing a portion of one strand, e.g. by enzymatic digestion to expose adjacent segments 526 and 528 and then hybridization with the complementary p-type and n-type substance-carrying oligonucleotides 530 and 532, respectively.

Figure 5C:
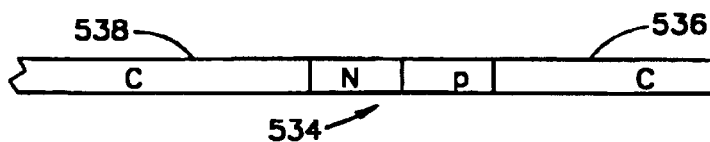

The remaining portion of the fiber, may, for example, be treated in a manner to fabricate a wire, such as that described above with reference to FIGS. 3A–3B or 4A–4B, and accordingly a diode (a p/n junction) 534 is formed with conducting wires (C) 536 and 538 flanking the two ends of the diode (FIG. 5C). In order to ensure that the conductor substance is not deposited on the p-n junction portion, the materials constituting the junction may first be coupled and only then the remaining portion of the fiber may be treated in a manner described above to form a conducting wire.

Figure 5D:
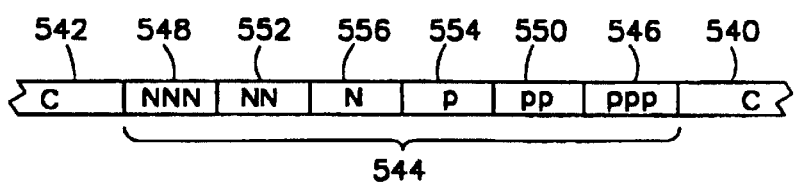

FIG. 5D is a schematic representation of another structure which in this case consists of two conducting wires (C) formed on two peripheral fiber portions 540 and 542 which flank a portion of the fiber which was transformed into a graded p/n junction 544. This exemplified junction consists of portions which are heavily doped 546 and 548 (ppp and nnn) portions which are moderately doped 550 and 552 (pp and nn) and portions which are only slightly doped 554 and 556 (p and n).

Figure 5E:
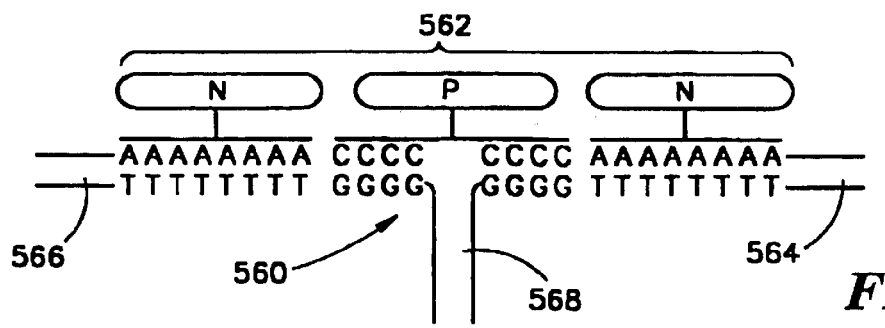

Another functionalized structure is shown in FIG. 5E. This structure is a junction which has a T-type branch point 560 and by converting the portion of the junction into an n-p-n bipolar junction 562 as illustrated (or a p-n-p junction) and then converting the remaining portions of the fibers 564, 566 and 568 into wires, a bipolar transistor is formed.

Figure 8A:
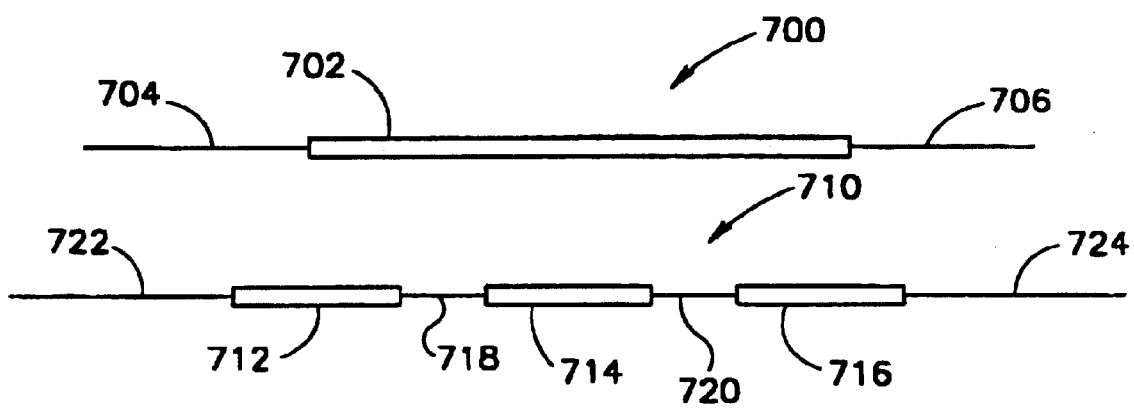
FIG. 8A shows two examples of fibers in accordance with embodiments of the invention comprising both nucleotide chains and non-nucleotide stretches.

Specific depositions of various substances can also be achieved by means other than hybridization. For example, various molecules, e.g. proteins, which are capable of recognizing specific domains, even without the need to "open" the double or multi-stranded nucleotide chain, may be used for this purpose.

p-n junctions may also be obtained in accordance with the invention in fibers of the kind illustrated in FIG. 8A, which consists of nucleotide chains attached to non-nucleotide fiber stretches made of a semi-conducting polymer. Where the semi-conducting polymer is p-type, an n-type polymer may be deposited on the nucleotide chain segment adjacent the semiconductor fiber segment in an analogous manner to that shown in FIGS. 5A–5E. Similarly, a p-n junction may be found by depositing a p-type polymer on a nucleotide chain segment adjacent an n-type semiconductor fiber sequence.

Figure 6:
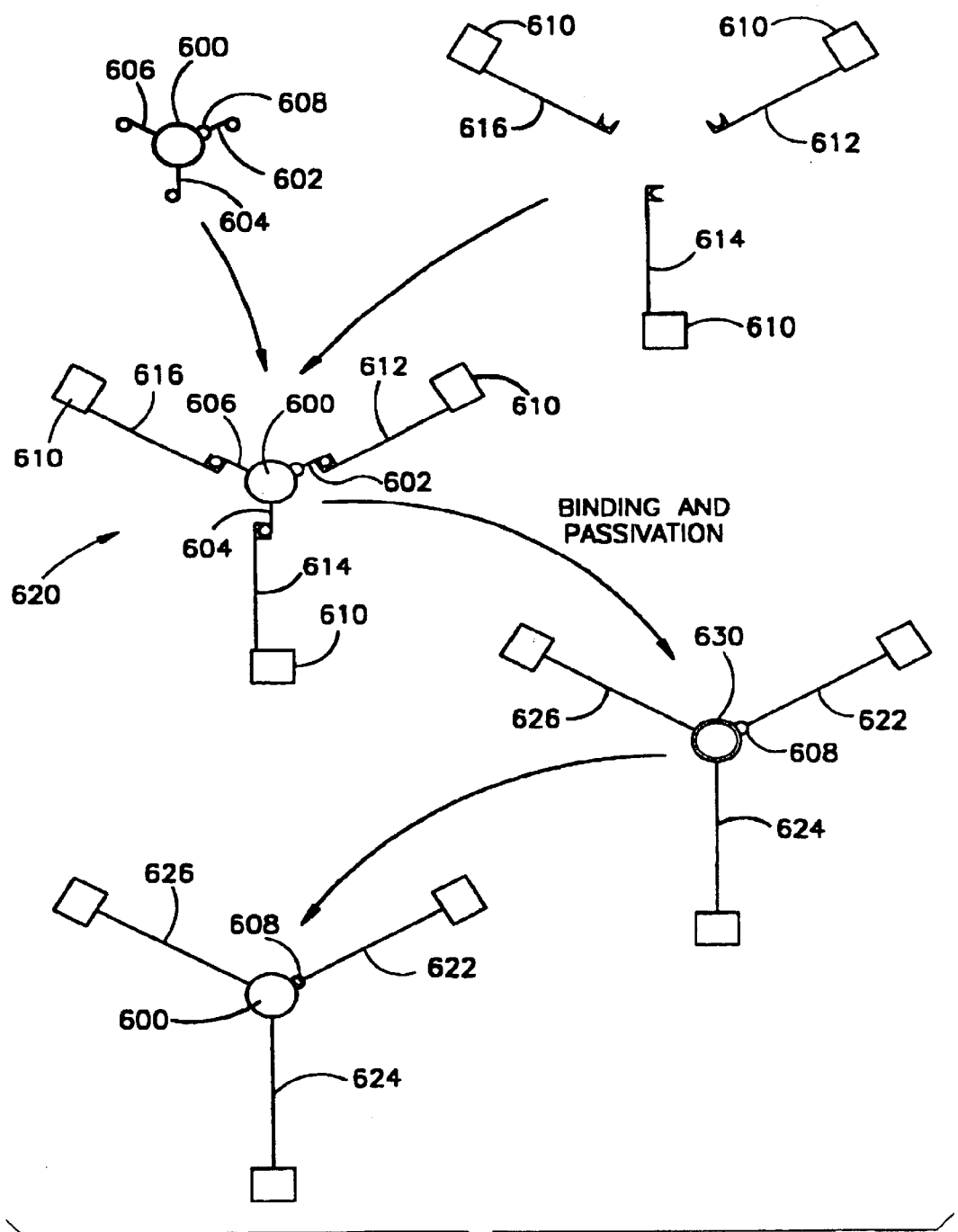
FIG. 6 is a presentation of the manner of forming a single electron transistor (SET) by one embodiment of the invention.

FIG. 6 shows a manner of construction of a single electron transistor (SET). A particle, 600 is made to bind with three different oligonucleotides 602, 604 and 606. One of the oligonucleotides is bound to particle 600 through a large non-conducting complexing agent 608, e.g. a protein or a supramolecular structure, the purpose of which will be explained further below. In an array of three electrodes 610, each electrode is bound to one of fibers 612, 614, and 616 (which may be a nucleotide fiber, a fiber of the kind illustrated in FIG. 8A and others), each of which has a different sticky end, complementary to a sequence in one of the oligonucleotides 602, 604 and 606. The oligonucleotides-dressed particle is contacted with the electrode array and by providing conditions for hybridization, a structure 620, consisting of electrodes 610 bound to particle 600 through three bridges, each of which consists of one of fibers 612, 614 and 616 and one of oligonucleotides 602, 604 and 606, respectively, is formed. Fibers 612, 614 and 616 may be made to covalently bind to oligonucleotides 602, 604 and 606, respectively, to form integral fibers 622, 624 and 626.

The particle is subjected to passivation treatment, e.g. by means of exposure to alkane thiol, octadecyl thiol, dodecyl thiol, etc., to form an insulating layer 630 to isolate the colloid particle from the surrounding medium and avoid metal deposition on the colloid particle in a subsequent step. Fibers 622, 624 and 626 are then formed into wires, e.g. in the manner described above, whereby a SET is formed.

In the SET, wire 622 serves as a gate and for its proper function, a high resistance between it and the particle 600 is preferred, which purpose is achieved by complexing agent 608. Under normal circumstances, particle 600 resists a current flow, but when the potential at the gate is changed, the electrostatic field formed reduces the activation energy required to charge or discharge the colloid particle whereby current can flow between wires 624 and 626.

As will be appreciated, the manner of construction of the SET described herein is but an example. One alternative method is first formation of a particle with fibers attached thereto and then causing the fibers to bind to the electrodes, e.g. through oligonucleotide linkers. As will be clear to the artisan, there are other possible alternatives allowing to construct a SET in accordance with the invention.

Reference is now being made to FIGS. 7A–7B, illustrating a molecular switch which is based on a reversible photo transformation. A molecular fragment, such as bis thiophene derivatives of hexafluorocyclopentene or maleimide, (FIGS. 7A and 7B, respectively), are bound to the networks. Polymer groups (P1 and P2 (which may be the same or different)) that may contain recognition groups which may be sequence selective or non sequence selective, are attached to both thiophene moieties via covalent or non covalent interaction to form a disrupted conjugated polymer. The polymers P1 and P2 are each connected to a different fiber (P1 and P2, respectively—not shown). Upon exposure to light with an appropriate wavelength (λ), photocyclization of the thiophenes with a double bond of the hexafluorocyclopentene or maleimide occurs, thus forming a conjugated polymeric wire electrically linking P1 and P2. Photo excitation of the cyclized switch results in the retrocyclization process and redisrupts the conjugation along the polymer.

The switching light signal may be provided from an external light source, or may be provided internally by any internal light source.

FIG. 8A illustrates schematically other embodiments of fibers in accordance with the invention: whereas the fibers shown above in FIGS. 3A–3B and 4A–4B, had a nucleotide skeleton, the fibers shown in FIG. 8A have a skeleton which is a composite structure consisting of both nucleotide segments and non-nucleotide segments. FIG. 8A shows two embodiments of fibers, fiber 700 and fiber 710. Fiber 700 has, as a major portion, a non-nucleotide fiber stretch 702 whose terminals are linked to two nucleotide chains 704 and 706. Non-nucleotide fiber stretch 702 may be a polymer, conducting, semi-conducting or non-conducting, or may be a nano-tube, e.g. a carbon-based nano-tube.

Fiber 710 consists of several non-nucleotide fiber stretches 712, 714, 716, connected by nucleotide chains 718 and 720 and flanked by two terminal nucleotide chain sequences 722 and 724. In such composite fibers, the oligonucleotide chains serve as recognition groups for binding to oligonucleotide chains of other fibers. Preferably, the non-nucleotide fiber stretches (702, of fiber 700 and 712, 714 and 716 of fiber 710) are made of a conducting or a semi-conducting material. The use of such non-nucleotide segments facilitates the construction of a variety of electronic components. Such substances may be of a molecular, macromolecular or non-molecular (heterogeneous) character and may be made of oligomers and polymers of thiophenes, pyrroles, anylines, acetylenes, phenylenes, metal complexes (such as axially interconnected porphyrins, platinum complexes, etc.) and nano-tubes, e.g. carbon-based nano-tubes.

Figure 8B:
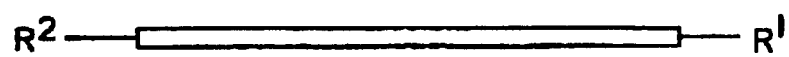
FIG. 8B is a schematic representation of a precursor fiber for the preparation of a fiber in accordance with an embodiment of the invention where the fiber's skeleton is essentially non-nucleic acid based, with nucleic acid chains forming only segments of the skeleton.

As illustrated schematically in FIG. 8B, such non-nucleotide fiber stretches may be selectively derivatized with active groups ($R^1$ and $R^2$) at their terminal sites. $R^1$ and $R^2$, may be the same or different and may represent —$NH_2$, —$CO_2H$, —$CO_2R$—Br—$B(OH)_2$, and many others.

Oligonucleotides bearing the complementary moieties may be covalently coupled to these terminal active groups. For example, a polythiophene can be prepared having two carboxylic groups at its two ends, as shown in FIG. 9. To these carboxylic groups, amino derivatized oligonucleotides may be attached using different methods, one as shown in FIG. 9 by the use of EDC by the formation of active esters on the carboxylic groups in a manner shown in FIG. 10, where "R" represents the conductive wire.

A similar approach may be applied for the selected derivatization of terminal groups of carbon nano-tubes using amino derivatized oligonucleotides. Carbon nano-tubes may have carboxylic groups at their two terminal ends (Wong et al., *Nature*, 394:52, 1998). To these ends, amino derivatized oligonucleotides may be attached via active ester coupling, as can be seen in FIG. 11.

A variety of other coupling methods may be applied for the connection of oligonucletoides to a fiber such as the use of metal ion-ligand interaction, the use of metal-metal complex, metal ion catalyzed hetero coupling methods, and others.

Figure 12A:
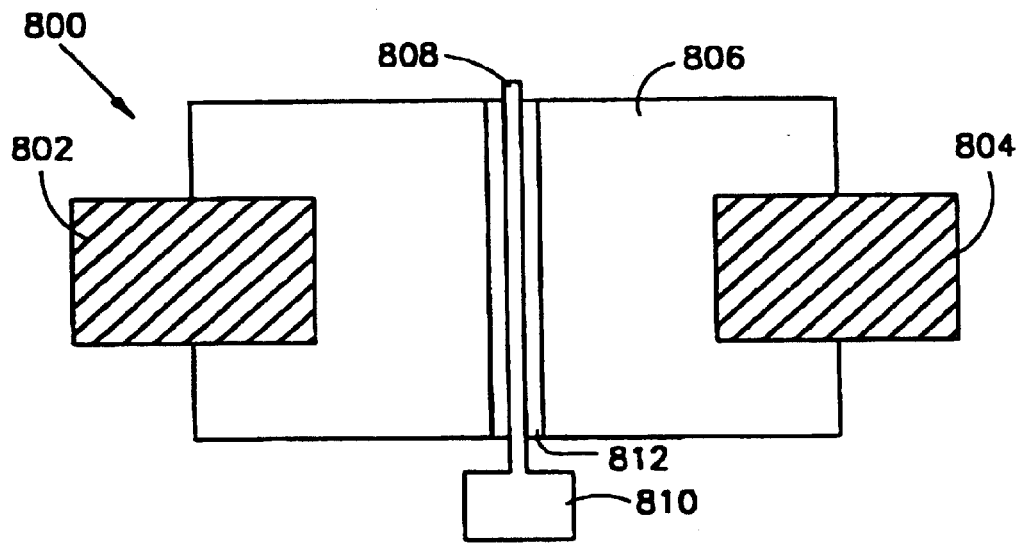
FIGS. 12A and 12B are illustrations of a semiconductor FET in accordance with an embodiment of the invention, shown in a planar view (FIG. 12A) and in a cross-sectional view (FIG. 12B).
Figure 12B:
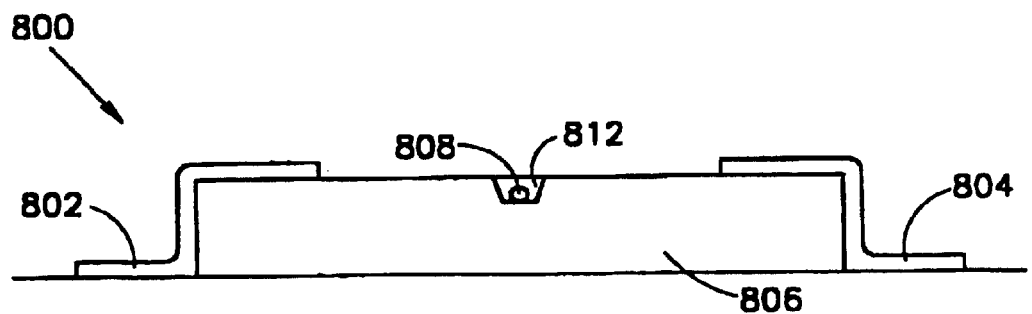

FIGS. 12A–12B are schematic illustrations of a FET in accordance with the invention. The FET 800 comprises source electrode 802, a drain electrode 804, situated at two ends of a semiconductor matrix 806. Gate wire 808, connected to gate electrode 810, is situated in a recess 812, within semiconductor matrix 806. The gate length in a semiconductor FET determines, to a large extent, the maximal frequency at which the FET can operate. Shorter gates minimize the electron flight time under the gate and hence facilitate higher operation frequencies. Since FET dimensions, apart from the gate, are not critical, the gate parameters set the bottle neck for mass production of faster FETS. The FET in accordance with the invention provides a solution to this problem. The FET, apart from the gate, may be fabricated by conventional lithography and semiconductor processes and techniques, and then the gate may be formed by stretching a nucleic acid fiber between electrodes and then the fiber may be metalized as outlined above. In this manner sub-0.1 micrometer gates can easily be formed allowing inexpensive mass production of faster FETS.

The invention will now be illustrated further in the following Examples.

EXAMPLES

Example 1

Figure 13:
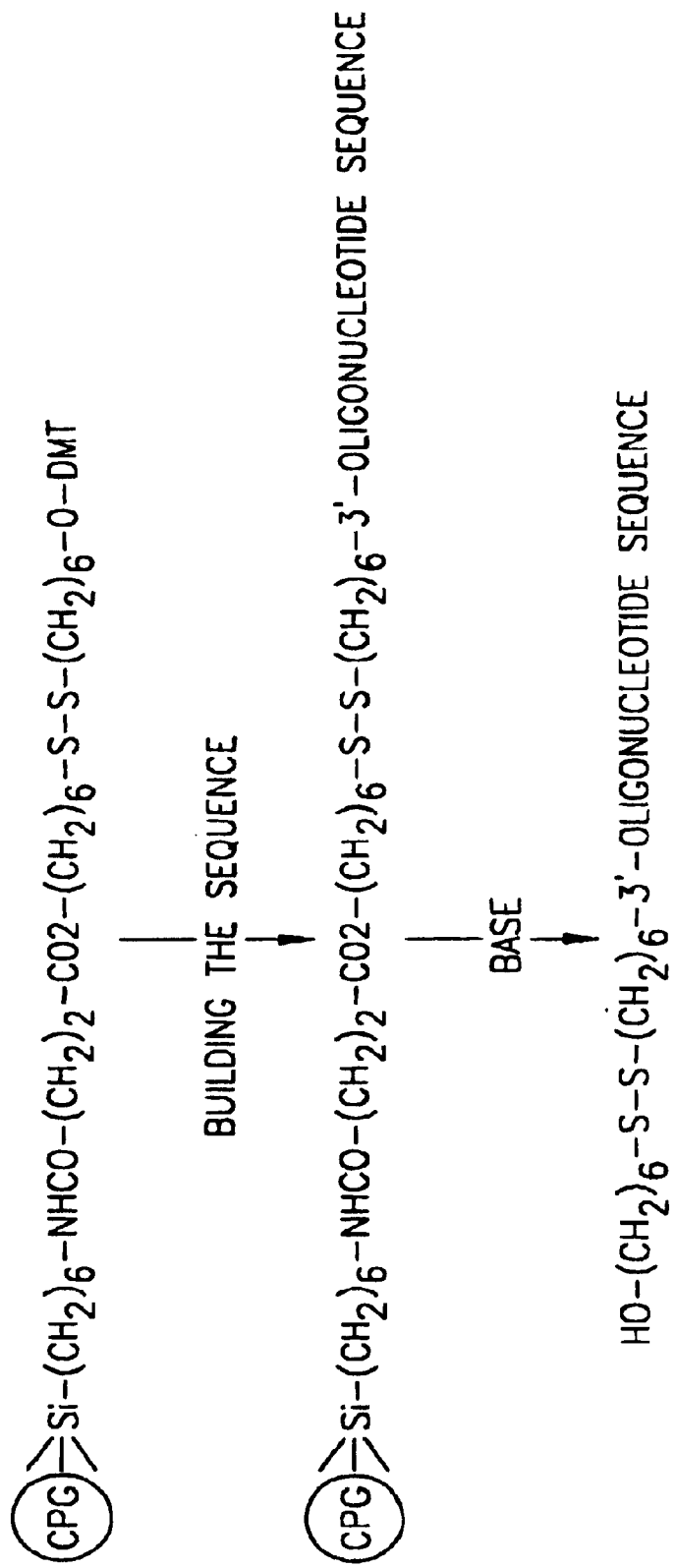
FIG. 13 shows the scheme for synthesizing an oligonucleotide, as described in Example 1(A).

Preparation of Linkers (a) Disulfide Based Linkers:

Controlled pore glass (CPG) derivatized with a disulfide group is used for the synthesis (starting from its 3' side) of an oligonucleotide having a free 5' site. The oligonucleotide is prepared using a conventional DNA synthesizer (see scheme in FIG. 13).

(b) Thiol-Based Linkers:

Linkers are being prepared according to (a) above and the disulfide bond is cleaved to obtain a free thiol.

(c) Biotin-Streptavidin Complex Based Linkers:

Biotin moiety is attached to an oligonucleotide having a specific sequence, as known per se. The biotin-oligonucleotide is coupled via a streptavidin molecule to another molecule containing a biotin moiety at one side (see also FIG. 1C) and a thiol or disulfide group on the other side.

(d) Repressor Based Linkers:

A nucleic acid binding protein, such as the lac repressor, is covalently attached to a thiol group. A DNA sequence is synthesized having sticky ends and containing the target sequence to which the repressor binds. The DNA sequence is coupled to the repressor through the target sequence.

(e) Thiophosphate Based Linkers:

The construction (starting from its 3' side) of an oligonucleotide sequence is carried out using a conventional DNA synthesizer wherein thiophosphates containing nucleotides are used instead of phosphate containing nucleotides.

(f) Artificial Site Specific Based Linkers:

A synthetic site-specific moiety such as, for example $Rh(Phen)_2Phi$, known to bind 5'-pyr-pyp-pur-3 sequence[26] (pyr=pyrimidine, pur=purine), is covalently coupled to a thiol group.

Example 2

Attachment of the Linker to an Electrode (a) Micropipette Wetting:

Electrodes are exposed to solutions of the appropriate linkers, for example, by employing pipettes or micropipettes or by any liquid dispensers. Such liquid dispensers may be fixed onto a manipulator that may be computer controlled.

Different types of linkers can be deposited on each electrode. Additionally, different types of linkers can be deposited simultaneously or sequentially on different electrodes.

(b) Jet Printing:

Ink-jet like printing techniques are used for the selective exposure of different electrodes to different linkers. By utilizing such a technique, it is possible to attain high precision, resolution and to increase rates of production, facilitating large scale production.

(c) Ab-Initio Electrode-Linker Synthesis:

(c1) Using Selective Masking Techniques:

The well developed technology used for synthesizing DNA sequences may be harnessed for the ab-initio preparation of a complex electrode-linker array. For example: an inert substrate composed of a set of electrodes is partially coated with an inert coating yielding two types of electrodes: coated electrodes (A) and uncoated electrodes (B). The substrate is exposed to a solution of a thiol linked to a nucleic acid sequence serving as a starting point for DNA synthesis. Due to the inert coating, only the uncoated B electrodes react with the thiol. Using standard DNA synthesizing techniques, a pre-defined sequence is produced on the B electrodes. The substrate is then rinsed and the masked electrodes are uncovered followed by the selective coating of B electrode. This procedure allows the production of two types of electrodes differing one from the other by the type of linkers bound thereto. The same technique with somewhat more complex steps (several steps of masking and unmasking) allows the fabrication of various substrates having many different electrodes with different linkers bound thereto.

(c2) Using Photodeprotection Techniques:

This approach involves the utilization of photolabile groups for the protection of the start point of DNA synthesis. Inactivated start point groups are unable to react with nucleotides. Using selective irradiation by means of a mask and/or a light conductor and/or any other addressable light source, the activation of different selected electrodes is achieved by the photoremoval of protecting groups from selected electrodes.

(c3) Using Blockers:

Using the masking technique ((c1) above) a set of electrodes is prepared for oligonucleotide synthesis. Once a DNA sequence is completed on one set of electrodes, a terminating group is attached to the oligonucleotide ensuring their inertness. Other sequences can be further synthesized on different electrodes that are prepared according to the previous step but become active according in this step. It should be noted that the set of linkers constructed in the previous step is not affected due to the attached blockers to their end points.

(c4) Electrode Printing:

Linkers are attached to conducting beads such as gold colloids. The colloids are then dispersed in a controllable manner to form conducting metal pads with linkers attached thereto. Dispensing may be achieved by the different techniques outlined above or by any conventional technique.

The above techniques may be used alone or in any combination with other techniques.

Example 3

Construction of Networks—Production of Junctions (a) Production of a Branched Sequence:

A stable four-arm branched DNA junction is constructed using for example the following sequences:

```
                          C-G
                          G-C
                          C-G
                          A-T
                          A-T
                          T-A
                          C-G
                          C-G
          G C A C G A G T   T G A T A C C G
          C G T G C T C A   A C T A T G G C
                          C-G
                          C-G
                          G-C
                          A-T
                          A-T
                          T-A
                          G-C
                          C-G
```

Careful planning of the sequences allows the fabrication of complex junctions according to a desired design. This branch sequence may be attached to double-stranded fibers using methods known per se.

(b) Creating a Branch by Enzymatic Reactions:

The protein recA from *E. coli* bacteria catalyzes the recombination and construction of a base-paired hybrid to joining two DNA molecules. It can join, in a specific way, a single-stranded DNA with a double-stranded DNA provided that homology exists between the single-stranded and the double-stranded DNA. DNA-binding proteins can extend single-stranded DNA and facilitate DNA annealing by random collisions. It is also possible to achieve base-pair specific contacts between two separate duplexes to form a four-stranded structure that is aligned through chemical moieties exposed in the grooves of the two helices. Similarly, the recA protein can induce specific contacts between a single-stranded and a double-stranded DNA, through recognition of the complementary sequence from the "outside" without the need to open the double strands and expose the single-strand sequence. There is also the possibility to recombine three-stranded and four-stranded DNA helices. Four DNA strands can also undergo "switch pairing" at a joining point to form a crossed-strand junction (called Holiday structure). There is then the possibility to create the so called heteroduplexes which are regions on recombinant DNA molecules where the two strands are not exactly complementary. The branching joint, however, can migrate to its equilibrium point of complementary base paring. Fully recombinant duplexes are formed by allowing steric rearrangements. The utilization of RecA protein for making the Holliday structures in vitro is well established (see, for example B. Alberts, et al., *Molecular Biology of the Cell*, 3rd Edition. Garland Publishing Inc., New York, 1994). Another enzyme, RecBC from *E. coli* bacteria has both unwinding and nuclease activities and can therefore catalyze the exposure of single-stranded DNA with a free end, allowing the RecA protein to start the pairing reaction. Important for the step-by-step build-up of the network, is the fact that RecBC initiates unwinding only on DNA containing a free duplex end. It then navigates along the DNA, from the free end, unwinding and rewinding DNA as it goes. Because it unwinds the DNA faster than rewinding it, "bubbles" or loops of single-stranded regions are created in the duplex DNA. RecA protein can then bind to a cut, made by the RecBC in a specific sequence, 5'-GCTGGTGG-3', in one of the single strands and initiates DNA strand exchange with another DNA. The specific sequence of the cut can be pre-designed by artificial recombinant DNA synthesis (see B. Alberts et al, supra and L. P. Adams et al., *The Biochemistry of the Nucleic Acids*, 11th Edition, Chapman & Hale, 1992).

(c) Utilizing Nucleic Acid-Binding Proteins:

Two or more specific DNA binding proteins are allowed to interact with two or more DNA strands. Coupling of such binding proteins enables the formation of a junction between the different DNA strands.

Example 4

Connection of Network to Substrate

Anchoring the network to the substrate may be realized using various DNA binding proteins. For example, repressors from bacteria (e.g. lac-repressor or λ-repressor) which can bind to both the substrate (such as a plastic substrate) and to the DNA thus joining the two. Such binding stabilizes the network without necessarily taking part in the electrical functionality.

Example 5

Preparation of an Integrated Circuit

The integrated circuit (IC) is composed of a substrate such as silicon, derivatized silicon, silica, derivatized silica, organic polymer or any other substance capable of acting as a support for the fabrication or mechanical fixation or stabilization of the network. The substrate may serve an electrical function.

A typical example for IC preparation is described in the following:

Example 6

Passivation of a Glass Substrate

A glass substrate is immersed in fuming nitric acid (100% $HNO_3$) for 10 min, rinsed in deionized (DI) water, then immersed in 1 N NaOH solution for an additional 10 min and rinsed in DI water. The cleaned glass is dried thoroughly, then immersed for c.a. 12 hrs in a solution of an alkyl tricholorosilane (octyl trichlorosilane, t-butyl trichlorosilane etc.) in tetrachloroethane (1:5 v/v). The glass plate is then rinsed carefully several times with tetrachloroethane and isopropanol, then dried thoroughly.

Example 7

Electrode Fabrication

Electrodes are fabricated according to one of the following routes: (i) Standard photo, electron, or x-ray lithography on the substrate and subsequent deposition of conductive substance (e.g. metal). Alternatively, the conductive substance may be deposited first and patterned next. (ii) Electrode assembly onto the surface: Patterning of the glass surface using polyelectrolytes such as polyetheyleneimine, polyalcoholes, polyacids, polypyridines etc. or other ligating agents such as a thiol monolayer (fabricated from organic compounds containing thiol and silane moieties at opposite sites on the molecular skeleton) followed by the fixation of electrically conducting components such as Gold colloids enabling the assembly of conducting electrodes onto the substrate.

Example 8

Electrical Functionalization of the Nucleic Acid Based Networks—Metal Based Conductive Wires (i) The relevant part of the network is exposed to a solution containing the appropriate metal ion, thus, ion exchange occurs at the phosphate groups of the DNA skeleton exposed to the solution. Intercalation of ions inside the DNA may also take place under certain conditions (ii) The ion exchanged DNA complex is then reduced by a reducing agent such as hydroquinone.

Cycles (i) and (ii) can be repeated in a sequential order until a conducting wire is achieved. Alternatively, the formation of conducting metal wire includes the following steps as stand-alone processes or in conjunction with steps (i) and (ii) or combined with one or more of the following techniques.

(iii) The relevant part of the ion-exchanged network is exposed to a metastable mixture of the reducing agent and the metal ion. Reduction takes place only at the surface of the metal clusters formed by steps (i) and (ii) thus, the gap between the metal clusters is bridged by the metal deposition process.

(iv) The ion exchanged DNA or the partially treated DNA network is exposed to electrochemical process, transforming the ions loaded on the DNA polyelectrolyte into a metallic conductor. In addition, electrochemical processes along the DNA molecule promote the vectorial growth of the metal wire along it.

(v) Photochemical deposition of the metal from its corresponding ions for the formation of the metallic wire.

(vi) Clusters or colloids are adsorbed onto the DNA network using sequence selective components, for example, specific sequences which are capable of binding to specific sites on the DNA, or non-sequence-specific binding agents, e.g. polyelectrolytes undergoing electrostatic interactions with the DNA. These Clusters and/or colloids serve as catalysts for processes (iii)–(v) above.

(vii) Defects in granular wires fabricated by one or more of the above techniques may be annealed using diverse methods such as thermal annealing processes, electrodeposition, etc.

An example of the fabrication of a silver-functionalized network is as follows:

(i) A DNA network fixed on a substrate is exposed to a basic solution of silver ions (pH=10.5, $NH_4OH$, 0.1 M $AgNO_3$). After the DNA polyelectrolyte is exchanged by the silver ions, the substrate is rinsed carefully with deionized water (DI) and dried.

(ii) The silver loaded DNA network fixed on a substrate is exposed to a basic solution of hydroquinone (0.05 M), pH=5 as a reducing agent. Steps (i) and (ii) are repeated sequentially until an electrically conducting wire is formed.

(a) Complementary Processes:

Step (iii) is performed after one or more (i)+(ii) cycles.

(iii) The DNA network loaded with silver metal clusters (after cycles (i) and (ii) have been performed) and after final rinsing with DI water is exposed to an acidic solution of hydroquinone (citrate buffer, pH=3.5, 0.05 M hydroquinone) and $AgNO_3$ (0.1 M). Cycle (iii) is terminated when the wire width attains the desired dimension. The process can be made light sensitive and thus can also be controlled by the illumination conditions.

(b) Electrochemical Deposition for Improved Process:

(iv) In order to improve the aspect ratio of the metallic conductor, an electrochemical process is performed. For that purpose, pre-treatment with an alkane thiol is performed prior to the (i)+(ii) processes. This ensures the inertness of the metal electrodes against electrochemical metal deposition. After one or more of the (i)+(ii) cycles, the electrodes connected through the DNA covered metal wire are connected to a current and bias controlled electrical source and the relevant part of the DNA network is exposed to a solution of the metal ion (different concentrations according to a specific protocol). The gaps between the conducting domains are filled via electrochemical metallic deposition.

(c) Photochemical Deposition for an Improved Process:

(v) In order to improve the aspect ratio of the metallic conductor, a photochemical process is performed in a similar manner to the electrochemical process outlined above but using photochemical reactions as driving processes. For example, metalization of a DNA network may be obtained using an electron donor (triethanolamine, oxalic acid, DTT etc.), a photosensitizer (Ru-polypyridine complexes, xanthene dyes semiconductor particles such as $TiO_2$, CdS etc.), an electron relay such as different bi-pyridinium salts and the relevant metal ion or metal complex. The photosensitizer transduces the absorbed light energy into a thermodynamic potential through electron transfer processes involving the electron donor and electron acceptor in any of the possible sequences. The reduced electron acceptor acts as an electron relay and charges the metal clusters/colloids with electrons. The charged clusters/colloids act as catalysts for the reduction of the metal ions thus inducing the growth of the metal conductor.

(d) Gold Clusters, Gold-Containing Molecules and/or Colloids as Nucleation Centers:

(vi) Instead of performing the first (i)+(ii) cycles, the relevant part of the DNA network is exposed to a solution of gold clusters, molecules or particles pre-coated (partially) with cationic thiols (such as pyridinium alkane thiol). The gold particles are being adsorbed to the DNA skeleton by ion pairing and the growth of the wire is attained using one or more of the above techniques.

(e) Curing Processes:

(vii) Defects in a granular wire obtained by one or a combination of the above techniques are annealed using diverse processes such as thermal annealing processes (hydrogen atmosphere (10% $H_2$ in $N_2$), 300 C. over several hours).

Example 9

Figure 14:
FIG. 14 shows a fluorescently labeled λ-DNA stretched between two gold electrodes (dark strips) 16 $\mu$m apart.

Connecting Two Electrodes by a Conductive Wire Formed on a DNA Template, and Properties of the Wire (a) Wire Preparation:

FIGS. 3A–3B outline the DNA templated assembly of a metal wire. A glass coverslip was first passivated against spurious DNA binding. Subsequently, two parallel gold electrodes were deposited on the coverslip using standard microelectronic techniques. One gold electrode was then wetted with a micron size droplet of an aqueous solution containing a 12-base, specific sequence oligonucleotide, derivatized with a disulfide group attached to its 3' side. Similarly, the second electrode was marked with a different oligonucleotide sequence. After rinsing, the sample was covered by a solution of about 16 $\mu$m long $\lambda$-DNA, having two 12-base sticky ends that were complementary to the oligonucleotides attached to the gold electrodes. A flow normal to the electrodes was induced to stretch the DNA, allowing its hybridization with the two distance surface-bound oligonucleotides. Stretching the DNA between two electrodes could also be carried out in reverse order, where hybridization and ligation of the disulfide derivatized oligonucleotides to the long DNA molecule was performed prior to its application to the sample. Both methods work equally well. FIG. 14 depicts a fluorescently-labeled $\lambda$-DNA bridging two gold electrodes. By observing the curving of the DNA molecule under perpendicular flow it was demonstrated that it was attached solely to the electrodes. Sample preparation was completed by removal of the solutions.

Two-terminal measurements performed on these samples prove that the stretched DNA molecule was practically an insulator with a resistance higher than $10^{13}$ $\Omega$. The insulating nature of the DNA was in accordance with previous spectroscopic electron-transfer rate measurements[18]. To instill electrical functionality, silver metal was vectorially deposited along the DNA molecule. The three-step chemical deposition process was based on selective localization of silver ions along the DNA through $Ag^+/Na^+$ ion-exchange [19] and formation of complexes between the silver and the DNA bases[19-22]. The $Ag^+/Na^+$ ion-exchange was monitored by following the quenching of the fluorescence signal of the labeled DNA. The process was terminated when fill quenching was achieved. After rinsing, the silver ion-exchanged—DNA complex was reduced using a basic hydroquinone solution. This step resulted in the formation of namometer size metallic silver aggregates bound to the DNA skeleton. These silver aggregates serve as spatially localized nucleation sites for subsequent growth of the wire. The ion-exchange process was highly selective and restricted to the DNA template only. The silver aggregates bound to the DNA, were further "developed", much as in the standard photographic procedure, using an acidic mixture of hydroquinone and silver ions under low light conditions[24,25,32-37]. Acidic solutions of hydroquinone and silver ions are metastable but spontaneous metal deposition is normally very slow. The presence of metal catalysts (such as the silver nucleation sites on the DNA), significantly accelerates the process. Under these experimental conditions, metal deposition therefore occurs only along the DNA skeleton, leaving the passivated glass practically clean of silver. The process was terminated when the trace of the metal wire was clearly observable under a differential interference contrast (DIC) microscope. The metal wire followed precisely the previous fluorescent image of the DNA skeleton. The structure, size and conductive properties of the metal wire were reproducible and dictated by the "developing" conditions.

Figure 15A:
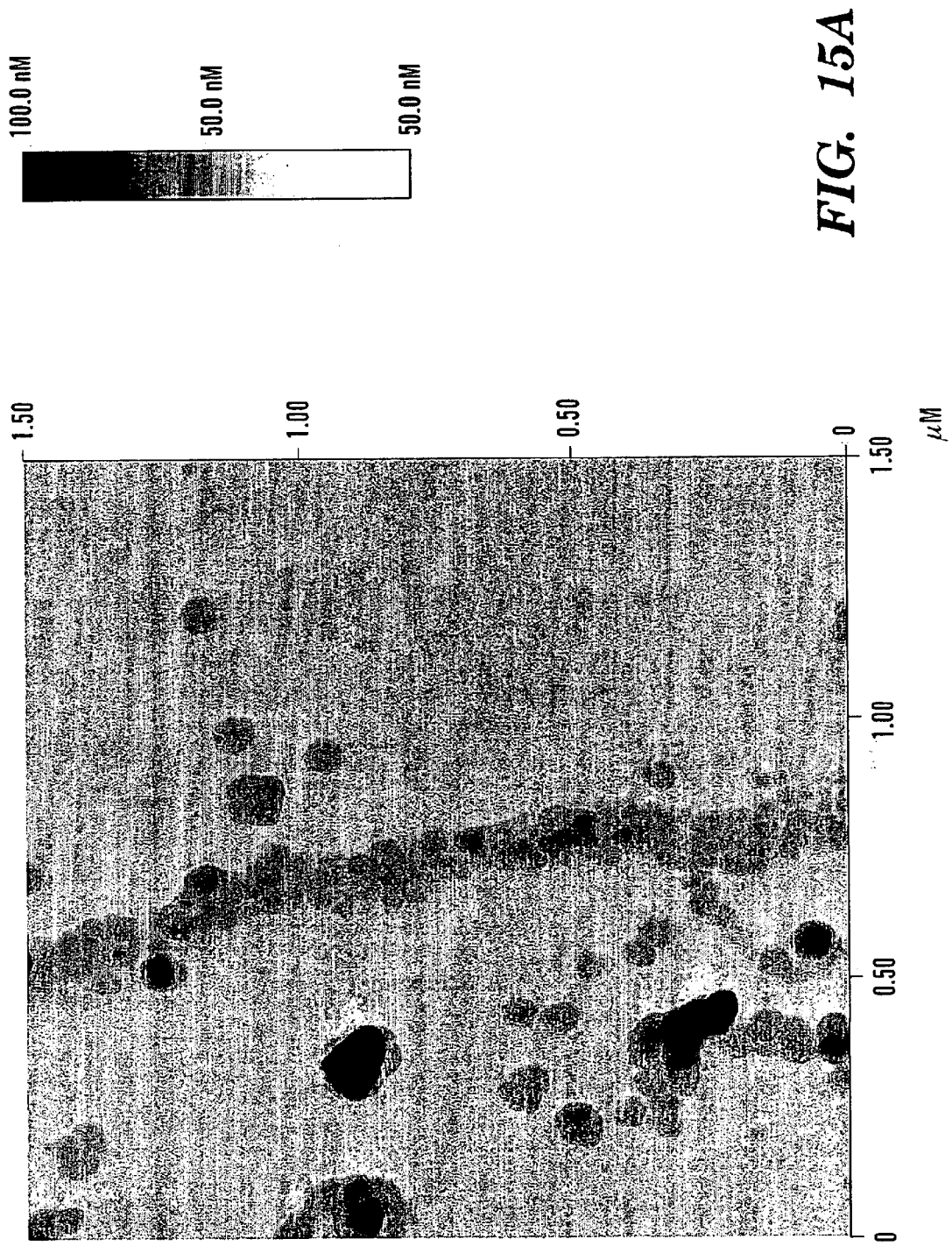
FIGS. 15A and 15B show atomic force microscope (AFM) images of a silver wire on a DNA template connecting two gold electrodes 12 $\mu$m apart in a field size of 1.5 $\mu$m (FIG. 15A) and 0.5 $\mu$m (FIG. 15B).
Figure 15B:
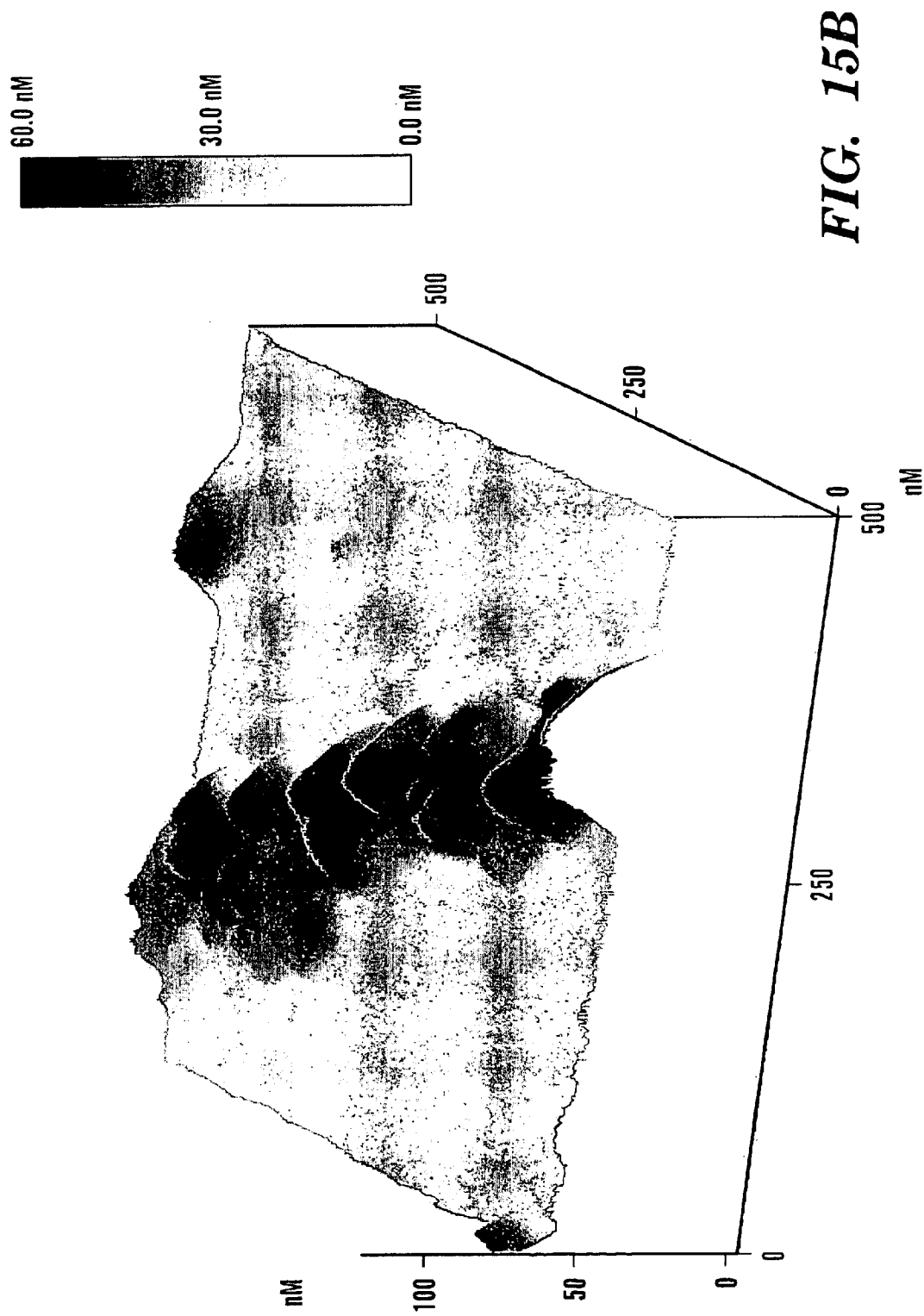

Results:

Atomic force microscope (AFM) images of a section of a 100 nm wide, 12 $\mu$m long wire are presented in FIGS. 15A and 15B. As clearly seen, the wire comprises 30–50 nm-diameter grains deposited along the DNA skeleton.

Figure 16A:
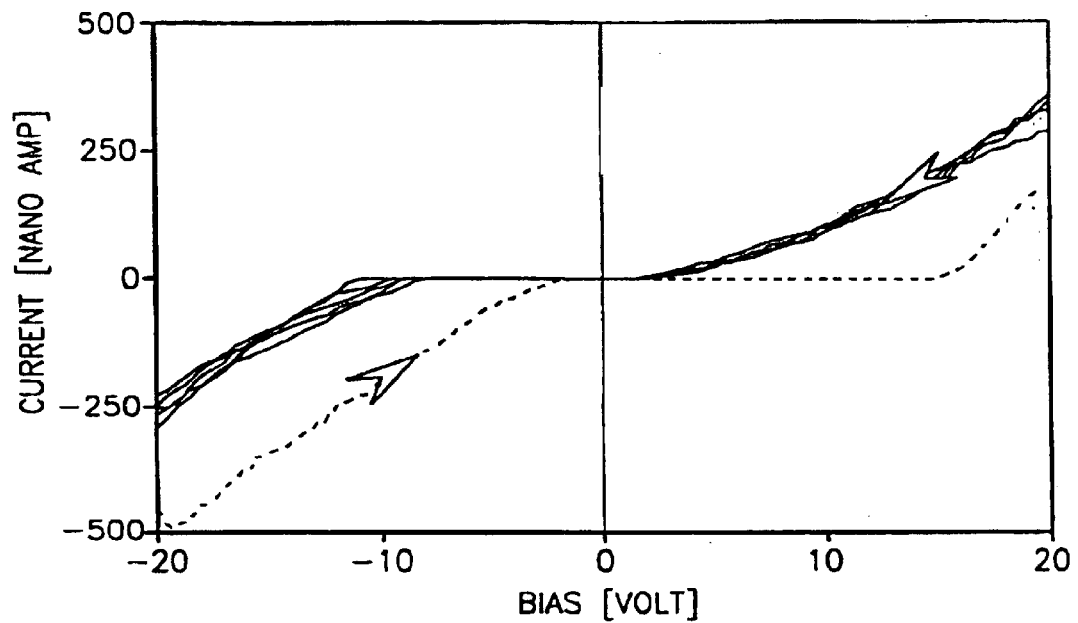
FIG. 16A depicts a two terminal I-V curves of the silver wire prepared according to Example 9. The arrows indicate the voltage scan direction. The solid-line curves are repeated scans and demonstrate the stability of the samples. Note the asymmetry in the I-V curves corresponding to the two scanning directions.
Figure 16B:
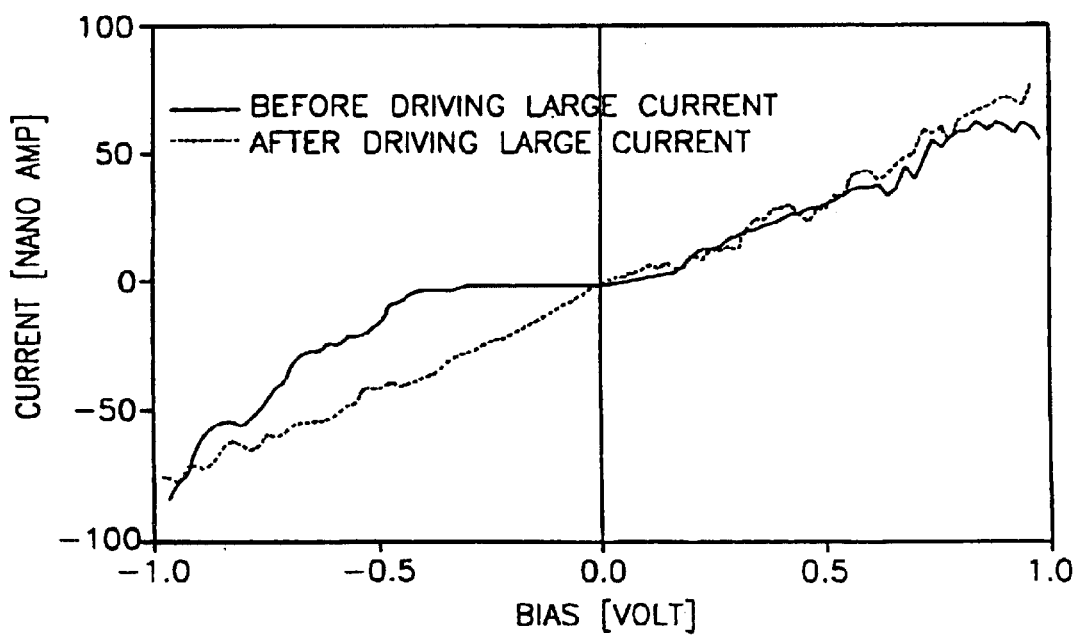
FIG. 16B shows the I-V curves of a different silver wire in which the silver growth was more extensive than in FIG. 16A. The more extensive silver growth resulted in a smaller current plateau, on the order of 0.5V, and a lower resistance (13 M$\Omega$ vs. 30 M$\Omega$ in FIG. 16B). By driving large currents through the wire, the plateau has been eliminated to give an ohmic behavior (dashed line), over the whole measurement range.

To study the electronic transport properties of these wires, two terminal I-V curves have been measured at room temperature using an HP parameter analyzer with internal resistance of $10^{13}$ $\Omega$ and current resolution of 10 fA. FIG. 16A shows the I-V curves of the silver wire presented in FIGS. 15A and 15B. The curves are highly non linear and asymmetric with respect to zero bias. The shapes of the curves depend on the voltage scan direction indicated by arrows in FIG. 16A. Approaching zero voltage from large positive or negative bias, the current vanishes almost linearly with voltage. A zero-current plateau then develops with differential resistance larger than $10^{13}$ $\Omega$. At higher bias, the wire turns conductive again with a differential resistance somewhat lower than in the original bias polarity. Repeated measurements in the same scan direction (solid curves in FIG. 16A) yield reproducible I-V curves. The length of the zero bias plateau in different wires can vary from a fraction of a volt to roughly 10 volts. The solid line in FIG. 16B depicts, for example, the I-V curve of a different wire in which the silver growth on the DNA was more extensive. As a result, the plateau was reduced to 0.5 volts.

By driving higher currents through the wire, the plateau could usually be eliminated to give an ohmic behavior (dashed line in FIG. 16B) with resistance varying between 1 and 30 M$\Omega$, depending on the silver deposition process.

Example 10

Deposition of Gold on an Oligonucleotide Fiber

A gold enhancer can be used for enhancing nucleation centers of practically any metal.

A gold enhancer solution may be prepared as follows:

30 $\mu$l of KSCN solution (from a stock solution prepared with 60 mg of KSCN dissolved in 1 ml $H_2O$) are added to 240 $\mu$l $H_2O$ and thoroughly mixed. 30 $\mu$l of a $KAuCl_4$ solution (from a stock solution prepared by dissolving 23 mg of $KAuCl_4$ in 1 ml $H_2O$) are added to the KSCN solution and mixed. Within several seconds the color changes from deep orange to a very light orange and then 60 $\mu$l hydroquinnon solution (from a stock solution prepared by dissolving 55 mg hydroquinnon in 10 ml $H_2O$) are added and the solution is thoroughly mixed.

The gold enhancer can be readily employed for gold growth on practically any metal. The growth rate can be tuned from 100 nm per few hours to 100 nm per minute by replacing some of the water with a phosphate buffer, pH=8.

Example 11

Organic Conjugated-Polymer Based Conducting Wires (i) The relevant part of the network is exposed to a solution containing a cationic segment capable of forming a conjugated-polymer by a chemical transformation or a cationic non conjugated-polymer capable of undergoing conjugation by a chemical transformation or a cationic conjugated-polymer. Thus, ion exchange process occurs at the phosphate groups of the DNA skeleton exposed to the solution.

(ii) The ion exchanged DNA complex is treated according to the nature of the organic species that is bound to the polyanionic skeleton. Electrical functionalization is achieved either by the former process or by a sequential doping process. Doping may be achieved via conventional redox processes, by protonation-deprotonation processes, by electrochemical means or by photochemical means. Additionally, sequence selective processes between the DNA skeleton and the building blocks of the above organic conjugated-polymer based conducting wires can be utilized for the production of wires with a well defined structure, electrical affinity gradients and p/n junctions.

I. The fabrication of a PPV (poly-phenylene vinylene) conducting wire is as follows:

(i) A DNA network fixed on a substrate is exposed to a solution of a pre-PPV water soluble polymer. After the DNA polyelectrolyte is exchanged by the pre-PPV polymer, the substrate is rinsed carefully and dried.

(ii) The pre-PPV polymer loaded DNA network fixed on the substrate is reacted in a vacuum oven (e.g 1e-6 bar, 300 C., 6 hr.).

(iii) The resulting luminescent PPV polymer is doped using conventional methods until displaying conductivity.

II. An Alternative route for the fabrication of a PPV conductive wire is as follows:

(i) A DNA network fixed on a substrate is exposed to a solution of a bis-(tetrahydrothiophenium)-p-xylilene dichloride. After the DNA polyelectrolyte is exchanged by the bis-(tetrahydrothiophenium)-p-xylilene dichloride, the substrate is rinsed carefully and dried.

(ii) The bis-(tetrahydrothiophenium)-p-xylilene dichloride loaded DNA network fixed on a substrate is polymerized in a basic solution to form a pre-PPV polymer attached to the DNA backbone.

(iii) The pre-PPV polymer loaded DNA network fixed on a substrate is reacted in a vacuum oven (1e-6 bar, 300 C., 6 hr.).

(iv) The resulting luminescent PPV polymer is doped using conventional methods until displaying desired conductivity.

III. The fabrication of a PANI (polyaniline) conducting wire is carried out as follows:

(i) A DNA network fixed on a substrate is exposed to a solution of an acid soluble PANI polymer. After the DNA polyelectrolyte is exchanged by PANI polymer, the substrate is rinsed carefully and dried.

(ii) The resulting PANI polymer is doped using conventional methods until displaying desired conductivity.

IV. An alternative route to the fabrication of a PANI conducting wire is as follows:

(i) A DNA network fixed on a substrate is exposed to a solution of anilinium ions. After the DNA polyelectrolyte is exchanged by the anilinium ion, the substrate is rinsed carefully and dried.

(ii) The anilinium ions loaded on the DNA skeleton are oxidized using a solution of an oxidizing agent such as peroxidisulphate ions, yielding a polyaniline polymer. The resulting PANI polymer is doped using conventional methods until displaying desired conductivity.

V. An alternative route to the fabrication of a PANI conducting wire is as follows:

(i) A DNA network fixed on a substrate is exposed to a solution of a short oligomer of PANI (>1 repeat unit). After the DNA polyelectrolyte is exchanged by the PANI oligomer, the substrate is rinsed carefully and dried.

(ii) The PANI oligomer ions loaded on the DNA skeleton are oxidized using a solution of an oxidizing agent such as peroxidisulphate ions, yielding a polyaniline polymer. The resulting PANI polymer is doped using conventional methods until displaying desired conductivity.

Example 12

Fabrication of Insulators

Insulators may be constructed on electrically functionalized parts of the network such as wires and connections between wires and components.

A. Insulation of Metallic Components (Including Metallic Wires):

(1) Metallic components may be electrically insulated from their environment using surface active agents composed of an insulating body such as an alkyl group attached to a surface binding group such as a thiol or a disulfide group. The surface binding group binds to the surface of the metal thus, forming a dense "two dimensional" layer of electrically insulating molecules at the surface of the metal. This layer presents an electrical barrier, namely, an insulator.

(2) The selective oxidation and other derivations that form non conducting layers and interfaces form electrically insulating barriers too.

B. Insulation of Non Metallic Components (Including Conjugated-Polymer Based Wires):

Using complementary interaction based molecular recognition processes, insulating layers that can self assemble onto the surface of non metallic components are constructed.

For example, positively charged polymers such as PANI can be coated and insulated from their environment using a polyanion polymer having long alkyl chain side groups.

Example 13

Attachment of a Gold-Containing Molecule or Particle to a Specific Nucleotide

Figure 17:
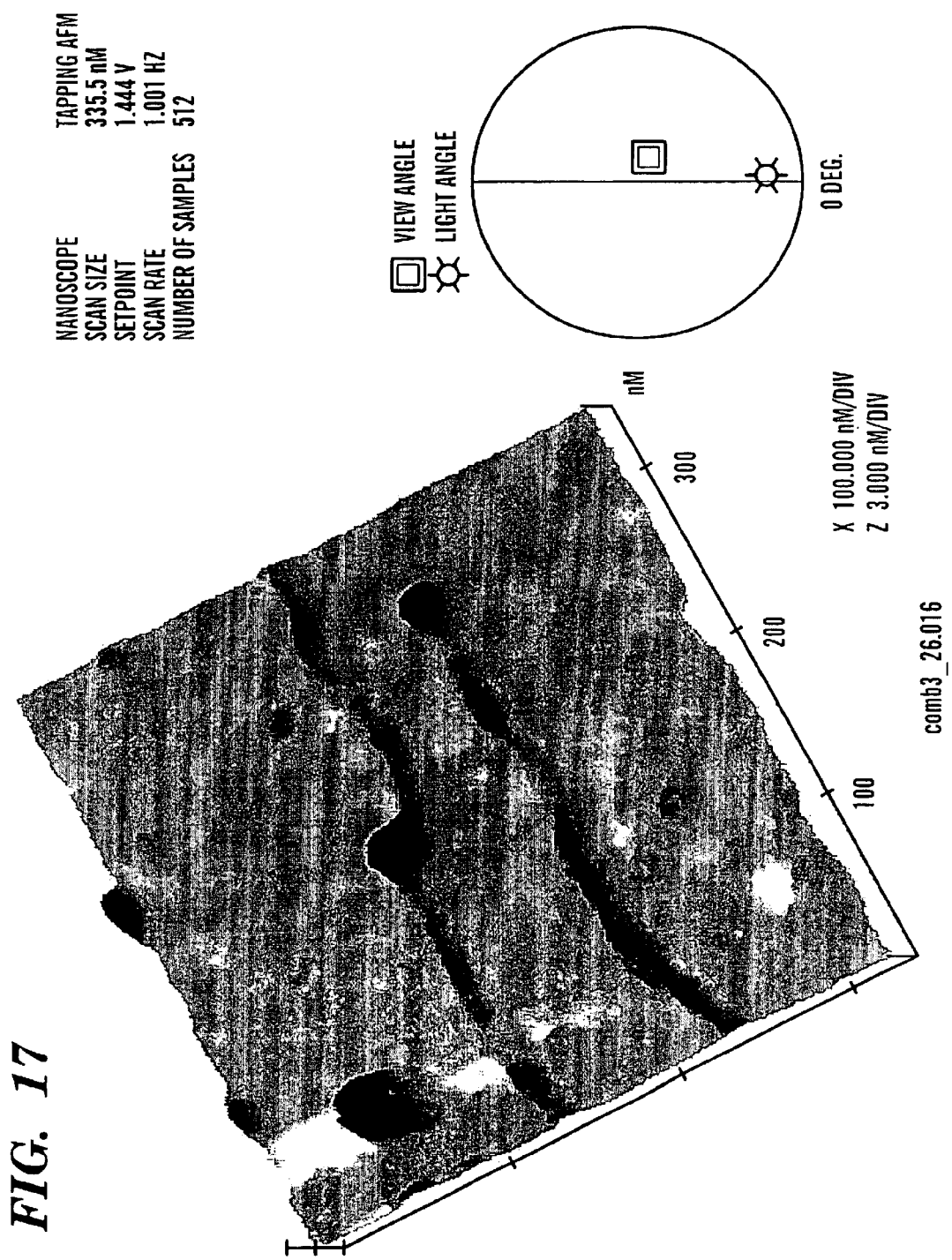
FIG. 17 shows an AFM image of the result of binding of gold colloids to biotin-modified nucleotides.

DNA bases are modified by attachment of a spacer arm connected to a chemically active group to specific sites in the bases. For the right sites and long enough spacer arms, such modifications do not interfere with the enzymatic machinery, leaving the DNA molecules compatible with the recombinant DNA techniques. One such modification is the attachment of biotin to a C or A base. At a next step, the specific binding of streptavidin to biotin is employed to the attachment of a streptavidin coated gold particle to the biotin label base. FIG. 17 shows an AFM image of the result of such manipulation. In this case, the last nucleotide in a long DNA molecule was replaced by a biotin labeled nucleotide. The template was then immersed in a solution containing streptavidin coated 5 nm gold colloids resulting in a specific attachment of these colloids to the modified bases. Since streptavidin has four binding sites for biotin, the coated colloid can also serve as a junction between labeled DNA molecules. A junction between two DNA molecules is also shown in FIG. 17. Groups other than biotin can also be used for labeling. Some examples include thiol, dig and amine.

Example 14

Preparation of a Single Electron Transistor (SET)

In the following the main steps in the fabrication of a SET are outlined:

1. Substrate passivation is carried out according to Example 6.
2. Gold electrode definition by standard microelectronic techniques is carried out, e.g. as specified in Example 7. For the simple case of a single SET only three electrodes are needed.
3. Linker synthesis, e.g. carried out according to Example 1(a). The Linkers are typically made of short (for example 12 bases) olygonucleotides derivatized with a disulfide group at their 3' side. For the case of a single SET, linkers with three different sequences are preferable.
4. Linkers are made to interact with the electrodes through their disulfide group. Each electrode is marked by a different linker according to Example 2.
5. Three different disulfide derivatized linkers are attached to the same nanometer scale gold particle at their disulfide side and one of the linkers is attached via a large bridging agent which creates a large barrier between the colloid and this linker.
6. Three double-stranded DNA molecules, a few micron long, containing sticky ends complementary to those of the linkers at the gold particle are hybridized and ligated with the linkers attached to the colloid to form a three terminal junction with the colloid at the branching point. The three DNA molecules also contain sticky ends complementary to the three linkers attached to the electrodes, at their sides opposite to the gold particle.
7. The network is completed by letting the double-stranded DNA molecules attached to the gold particle to hybridize with the three linkers on the electrodes, followed by ligation of the nicks.
8. Electrical functionality is achieved by the following steps:
    a) The gold particle is coated by an alkane thiol layer to be used as an insulating barrier, and passivation layer against metal deposition.
    b) The DNA chains are coated with metal to form conducting wires, for example as specified in Example 8. The wires are electrically weakly coupled to the gold particle through the alkane thiol layer insulating barrier with one wire coupled through the large bridging agent having even weaker coupling to the particle.
    c) FIG. 6 outlines the final device composed of a gold particle wired to three electrodes through the insulating barriers.

The current between two electrodes can now be modulated by a small voltage applied to the third electrode (the one very weakly coupled to the particle). The circuit hence function as a SET. The SET can be fabricated as a part of a more complex circuit where the electrodes are replaced by functionalized network components.

It should be appreciated that the sequence of steps from the preparation of the SET may be altered, thus for example, step 6 may precede step 4, etc.

Example 15

PPV Functionalized Fiber as a Light Source

The process described in Example II may be followed up to and including step I(ii). The resulting PPV component is highly luminescent and has a width considerably smaller than 100 nm. Fabricating the PPV component between electrodes of appropriate work functions then forms an electroluminescent device.

What is claimed is:

1. An electric network comprising:
    at least one nucleotide fiber comprising a chain of nucleotides and defining the networks geometry; and
    one or more substances, molecules, clusters of atoms or molecules or particles bound to said nucleotide fiber or complexed therewith continuously along said fiber to form at least one electric or electronic component or a conductor,
    the network being electrically connected to an electrically conducting interface component for electric communication with an external electric component or circuitry.

2. A network according to claim 1, wherein at least one of the network components is a wire.

3. A network according to claim 1, comprising at least two nucleotide fibers connected to one another at a junction in which one nucleotide segment of one fiber is bound to another nucleotide segment of another fiber by a sequence-specific interaction.

4. A network according to claim 1, comprising a junction between a first nucleotide fiber and a second nucleotide fiber, formed by a molecule, cluster of atoms or molecules or a particle bound to each of the nucleotide fibers.

5. A network according to claim 1, comprising an entity being a molecule, cluster of atoms or molecules or a particle, which entity changes from an electrically conducting to an electrically non-conducting state by transfer of electrons to or from said entity, wherein the entity is bound to one or more of the at least one nucleotide fiber.

6. A network according to claim 1, comprising nucleotides which have been chemically modified by attaching thereto a substance molecule, cluster of atoms or molecules or particles.

7. A network according to claim 6, wherein the chemically modified nucleotides are included in the network:
(i) in junction between nucleotide fibers for binding the nucleotide fibers to one another,
(ii) in junction between a nucleotide fiber and a linker that binds a nucleotide fiber to an electronic component of the network, or
(iii) in junction between a nucleotide fiber or an electronic component and an interface component.

8. A network according to claim 6, wherein the chemically modified nucleotide carries one member of a binding couple for binding to another component comprising the other member of the binding couple.

9. A network according to claim 6, wherein the chemically modified nucleotide carries a thiol, amine residue, an active ester or a carboxyl group.

10. A network according to claim 1, having
(a) at least one conductor being a wire constructed on a nucleotide fiber comprising at least one nucleic acid chain;
(b) at least one electronic component being electrically connected to said at least one wire and being constructed either on a nucleic acid chain which has been chemically or physically modified by depositing one or more molecules, cluster of atoms or molecules or particles thereon, or being constructed by a molecule, cluster of atoms or molecules or a particle situated at a junction between two or more nucleic acid chains of different fibers.

11. A network according to claim 1, comprising two or more nucleotide fibers assembled to form the network on the basis of sequence-specific interaction of nucleic acid chains.

12. A network according to claim 5, wherein at least one nucleic acid chain is formed into an electric or electronic component by sequence or domain-specific binding thereto of said substances, molecules, clusters of atoms or molecules or particles.

13. A network according to claim 1, wherein at least one nucleotide fiber is made electrically conductive by substances comprising a metal bound to the nucleotide fiber or portion thereof.

14. A network according to claim 1, wherein the network comprises at least one wire formed by non-metallic conducting substance bound to a nucleotide fiber or portion thereof.

15. A network according to claim 1, wherein at least one nucleotide fiber has at least a portion bound to semi-conducting substances.

16. A network according to claim 15, wherein the at least a portion, is a sequence within a nucleotide chain.

17. A network according to claim 1, wherein one of two adjacent portions of at least one nucleotide fiber are bound to a p-type semi-conducting substance and the other to an n-type semi-conducting substance, whereby the two adjacent portions of the nucleotide fiber constitute a p/n junction.

18. A network according to claim 1, comprising at least one nucleotide-based junction formed by hybridization of complementary sequences of nucleotide chains in at least two nucleotide fibers.

19. A network according to claim 18, wherein said junction is formed into bipolar transistors, comprising:
(a) a p-type semi-conducting substance bound to a first nucleotide fiber at the junction and an n-type semi-conducting substance bound to adjacent, second nucleotide fiber at both sides of the first nucleotide fiber, or
(b) an n-type semi-conducting substance bound to a first nucleotide fiber at the junction and a p-type semi-conducting substance bound to adjacent, second nucleotide fiber at both sides of the first nucleotide fiber.

20. A network according to claim 1, comprising at least one input/output interface component connected to at least one network component in a manner allowing electric conductivity between said interface component and said network component.

21. A network according to claim 20, comprising at least two interface components, each one connected to at least one nucleotide fiber or electronic component of the network.

22. A network according to claim 20, wherein said interface component is connected to a wire, said wire comprising a nucleotide fiber.

23. A network according to claim 22, wherein the nucleotide fiber has a nucleotide end segment, and is bound to the interface component by a specific interaction with a complexing agent bound to a linker attached to the interface component.

24. A network according to claim 23, wherein the linker comprises a nucleotide chain, and said nucleotide end segment is bound thereto by sequence-specific interaction.

25. A network according to claim 20, wherein said interface component is bound to a nucleotide fiber that is bound to an electronic component of the network.

26. An electronic circuit comprising a network according to claim 1.

27. A method for making an electronic network, comprising:
(a) providing an arrangement comprising at least one electrically conductive interface component;
(b) attaching a linker to the at least one interface component;
(c) contacting said arrangement with at least one nucleotide fiber comprising a chain of nucleotides and defining the network's geometry, with a sequence capable of binding to the linker, and permitting binding of said sequences to said linker; and
(d) electrically or electronically functionalizing the at least one nucleotide fiber by depositing thereon or complexing thereto at least one substance or particles.

28. A method according to claim 27, wherein the network is formed by self-assembly as a result of chemical complementary and molecular recognition properties of at least one nucleotide fiber to at least one other nucleotide fiber or between at least one nucleotide fiber and at least one specific sequence or domain-recognizing complexing agent.

29. A method according to claim 27, comprising mixing nucleotide fibers and components together and allowing them to self-assemble into a network by means of specific molecule interactions.

30. A method according to claim 27, comprising forming junctions between nucleotide fibers and at least one molecule, cluster of atoms or molecules or particles, said molecule clusters or particles serving as an electronic component in the network.

31. A method according to claim 27, wherein said functionalization is achieved by forming on said nucleotide fiber at least one nucleation center from which said substance or particles are grown.

* * * * *

UNITED STATES PATENT AND TRADEMARK OFFICE
CERTIFICATE OF CORRECTION

PATENT NO. : 6,946,675 B2
DATED : September 20, 2005
INVENTOR(S) : Erez Braun et al.

It is certified that error appears in the above-identified patent and that said Letters Patent is hereby corrected as shown below:

<u>Title page,</u>
Item [22], PCT Filed, should read -- Jul. 14, 1998 --.
Item [87], PCT Pub. Date, should read -- Jan. 28, 1999 --.

Signed and Sealed this

Eleventh Day of April, 2006

JON W. DUDAS
*Director of the United States Patent and Trademark Office*